United States Patent
Lin et al.

(10) Patent No.: US 11,855,178 B2
(45) Date of Patent: *Dec. 26, 2023

(54) SEMICONDUCTOR DEVICES HAVING AIR-GAP

(71) Applicant: TAIWAN SEMICONDUCTOR MANUFACTURING COMPANY, LTD., Hsinchu (TW)

(72) Inventors: Chun-Hsiung Lin, Zhubei (TW); Pei-Hsun Wang, Kaohsiung (TW); Chih-Chao Chou, Hsinchu (TW); Chia-Hao Chang, Hsinchu (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/875,125

(22) Filed: Jul. 27, 2022

(65) Prior Publication Data

US 2022/0367668 A1    Nov. 17, 2022

Related U.S. Application Data

(60) Continuation of application No. 17/074,046, filed on Oct. 19, 2020, now Pat. No. 11,563,104, which is a
(Continued)

(51) Int. Cl.
*H01L 29/66* (2006.01)
*H01L 29/08* (2006.01)
(Continued)

(52) U.S. Cl.
CPC ...... *H01L 29/6653* (2013.01); *H01L 21/0337* (2013.01); *H01L 21/764* (2013.01);
(Continued)

(58) Field of Classification Search
CPC ............. H01L 29/6653; H01L 21/0337; H01L 21/764; H01L 21/76832; H01L 21/823431;
(Continued)

(56) References Cited

U.S. PATENT DOCUMENTS 9,368,572 B1 * 6/2016 Cheng ............... H01L 29/78696
9,666,533 B1 * 5/2017 Basker .................. H01L 23/485
(Continued)

OTHER PUBLICATIONS

U.S. Appl. No. 17/074,046, filed Oct. 19, 2020.
U.S. Appl. No. 16/178,928, filed Nov. 2, 2018.

*Primary Examiner* — Jonathan Han
(74) *Attorney, Agent, or Firm* — Birch, Stewart, Kolasch & Birch, LLP

(57) ABSTRACT

A semiconductor device is provided. The semiconductor device includes a fin protruding from a semiconductor substrate and a gate structure formed across the fin. The semiconductor device also includes a gate spacer formed over a sidewall of the gate structure. The gate spacer includes a sidewall spacer and a sealing spacer formed above the sidewall spacer. In addition, an air gap is vertically sandwiched between the sidewall spacer and the sealing spacer. The semiconductor device further includes a hard mask formed over the gate structure and covering a sidewall of the sealing spacer.

20 Claims, 23 Drawing Sheets

Related U.S. Application Data division of application No. 16/178,928, filed on Nov. 2, 2018, now Pat. No. 10,811,515.

(60) Provisional application No. 62/732,659, filed on Sep. 18, 2018.

(51) Int. Cl.
| | |
|---|---|
| *H01L 29/06* | (2006.01) |
| *H01L 29/78* | (2006.01) |
| *H01L 21/033* | (2006.01) |
| *H01L 21/8234* | (2006.01) |
| *H01L 27/088* | (2006.01) |
| *H01L 21/768* | (2006.01) |
| *H01L 21/764* | (2006.01) |

(52) U.S. Cl.
CPC .......... *H01L 21/76832* (2013.01); *H01L 21/823431* (2013.01); *H01L 21/823468* (2013.01); *H01L 27/0886* (2013.01); *H01L 29/0649* (2013.01); *H01L 29/0847* (2013.01); *H01L 29/6656* (2013.01); *H01L 29/66545* (2013.01); *H01L 29/66795* (2013.01); *H01L 29/785* (2013.01)

(58) Field of Classification Search
CPC ......... H01L 21/823468; H01L 27/0886; H01L 29/0649; H01L 29/0847; H01L 29/66545; H01L 29/6656; H01L 29/66795; H01L 29/785; H01L 21/7682; H01L 21/76834; H01L 23/485; H01L 29/41791; H01L 29/4991; H01L 29/165; H01L 29/42384; H01L 29/78696; H01L 27/10876; H01L 29/42356; H01L 29/4236
USPC ......... 257/E21.44, E137, E29.275, E21.209; 438/283, 284

See application file for complete search history.

(56) References Cited

U.S. PATENT DOCUMENTS

| | | | |
|---|---|---|---|
| 2014/0299989 A1* | 10/2014 | Lim ............... | H10B 12/0335 257/751 |
| 2015/0091089 A1* | 4/2015 | Niebojewski ....... | H01L 29/6656 438/151 |
| 2017/0162650 A1 | 6/2017 | Cheng et al. | |

* cited by examiner

SEMICONDUCTOR DEVICES HAVING AIR-GAP

PRIORITY CLAIM AND CROSS-REFERENCE

This application is a continuation application of U.S. application Ser. No. 17/074,046, filed on Oct. 19, 2020, which is a divisional application of U.S. application Ser. No. 16/178,928, filed on Nov. 2, 2018, which claims the benefit of U.S. Provisional Application No. 62/732,659, filed on Sep. 18, 2018, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor integrated circuit (IC) industry has experienced exponential growth. Technological advances in IC materials and design have produced generations of ICs where each generation has smaller and more complex circuits than the previous generation. As the semiconductor IC industry has progressed into nanometer process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, there are still various challenges in the fabrication of FinFET devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
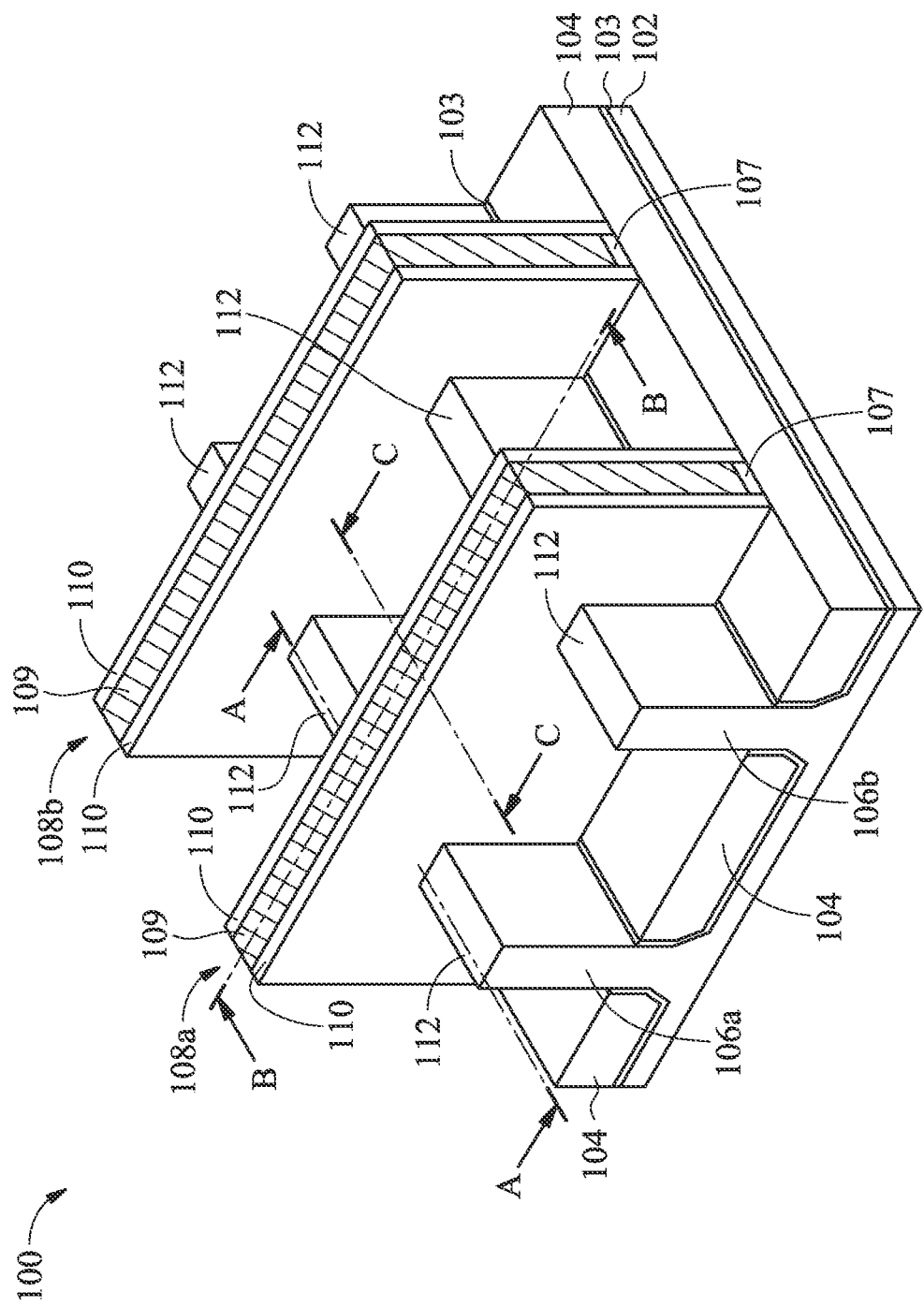
FIG. 1 shows a perspective view of a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments disclosed herein relate generally to fabricating semiconductor devices having air-gap spacers. The air-gap spacers have extreme-low dielectric constant (k value of about 1) and can provide excellent electrical isolation for a gate structure. In some embodiments, disposable spacers are formed on the sidewalls of the gate structure. The gate structure is etched-back to form a space between the disposable spacers. The disposable spacer is thereby exposed through the space. Thereafter, the disposable spacer is removed using an etching process through the space to form a trench between the gate structure and an interlayer dielectric layer around the gate structure. Next, the trench is sealed with a sealing spacer to form an air-gap spacer.

According to embodiments of the disclosure, the formation of the air-gap spacer can be integrated with a replacement gate process (also referred to as a gate-last process). Moreover, the air-gap spacer is formed with less loss of the height of the gate structure. The position of the air-gap spacer can be self-aligned with the height of the gate structure. In addition, the formation of the air-gap spacer can be compatible with a gate-helmet process, in which a hard mask is formed on the gate structure.

The foregoing broadly outlines some aspects of the embodiments described herein. Some embodiments described herein are described in the context of Fin Field Effect Transistor (FinFET) devices, and more particularly, in the context of forming air-gap spacers in FinFET devices. Some variations of the exemplary methods and structures are described. A person having ordinary skill in the art will readily understand other modifications may be made that are contemplated within the scope of other embodiments. Implementations of some aspects of the present disclosure may be used in other processes and/or in other devices. For example, other devices may include planar FETs, it-gate FETs, a-gate FETs, Gate-All-Around (GAA) FETs or another device. Throughout the various views and illustrative embodiments, like reference numbers are used to designate like elements. Although embodiments of the method may be described in a particular order, various other embodiments of the method may be performed in any logical order and may include fewer or more steps than what is described herein.

FIG. 1 illustrates a perspective (three-dimensional) view of a semiconductor device 100 such as an example of simplified FinFETs, in accordance with some embodiments. Other aspects not illustrated in or described with respect to FIG. 1 may become apparent from the following figures and description. The structure in FIG. 1 may be electrically connected or coupled in a manner to operate as, for example, one transistor or more, such as four transistors.

The semiconductor device 100 includes multiple fins 106a and 106b protruding from a semiconductor substrate 102. The semiconductor substrate 102 may be a bulk semiconductor substrate, or a semiconductor-on-insulator (SOI) substrate, which may be doped (e.g., with a p-type or an n-type dopant) to form various well regions or doped regions therein, or undoped. Generally, an SOI substrate includes a layer of a semiconductor material formed on an insulator layer. The insulator layer may be a buried oxide (BOX) layer, a silicon oxide layer, or the like. The insulator layer is provided on a silicon or glass substrate. The semiconductor substrate 102 may be made of silicon or another semiconductor material. For example, the semiconductor substrate 102 is a silicon wafer. In some examples, the semiconductor substrate 102 is made of a compound semiconductor such as silicon carbide, gallium arsenic, indium arsenide, or indium phosphide. In some examples, the semiconductor substrate 102 is made of an alloy semiconductor such as GaAsP, AlInAs, AlGaAs, GaInAs, GaInP, or GaInAsP.

Multiple isolation structures 104 are formed on the semiconductor substrate 102, and each of the fins 106a and 106b protrudes above the isolation structures 104 and is disposed between neighboring isolation structures 104, as shown in FIG. 1 in accordance with some embodiments. The isolation structure 104 is, for example a shallow-trench-isolation (STI) structure, which surrounds the bottom portions of the fins 106a and 106b. The isolation structure 104 is disposed between neighboring pairs of fins 106a and 106b. In addition, a liner 103 is formed between the isolation structures 104 and the semiconductor substrate 102. The liner 103 is also conformally deposited on the sidewalls of the fins 106a and 106b, and is disposed between the isolation structures 104 and the fins 106a and 106b.

In some embodiments, the fins 106a and 106b are formed by patterning the semiconductor substrate 102 using photo- lithography and etching processes to form multiple trenches in the semiconductor substrate 102. Each of the trenches is between neighboring pairs of fins 106a and 106b. The etching process may include a reactive ion etch (RIE), neutral beam etch (NBE), inductive coupled plasma (ICP) etch, or a combination thereof. A liner material layer is conformally deposited in the trenches, on the semiconductor substrate 102 and along the sidewalls and the top surfaces of the fins 106a and 106b. The liner material layer may be silicon oxide, silicon nitride or silicon oxynitride. The liner material layer may be deposited using chemical vapor deposition (CVD) process, physical vapor deposition (PVD) process or atomic layer deposition (ALD) process.

Each of the trenches between neighboring pairs of fins 106a and 106b is filled with an insulating material. In some examples, the insulating material is for example silicon oxide, silicon nitride, silicon oxynitride, fluoride-doped silicate glass (FSG), or another low dielectric constant (low-k) dielectric material. The trenches may be filled with the insulating material using a deposition process, such as CVD process, flowable CVD (FCVD) process, spin-on-glass (SOG) process, or another applicable process. After the deposition process, the insulating material and the liner material layer may be planarized using a chemical mechanical polishing (CMP) process to be coplanar with the top surfaces of the fins 106a and 106b. Next, the filled insulating material and the liner material layer are recessed to form the isolation structures 104 and the liner 103, as shown in FIG. 1 in accordance with some embodiments. The insulating material and the liner material layer may be recessed using a dry etching process to form the isolation structures 104 and the liner 103 that are lower than the top surfaces of the fins 106a and 106b. The dry etching process may use etching gases including hydrogen fluoride (HF) gas, ammonia ($NH_3$) gas, and dilute gas (such as $N_2$ or Ar).

Multiple dummy gate structures 108a and 108b are formed across the fins 106a and 106b, along the sidewalls and over the top surfaces of the fins 106a and 106b, as shown in FIG. 1 in accordance with some embodiments. Furthermore, the dummy gate structures 108a and 108b are formed on the isolation structures 104. The longitudinal direction of the dummy gate structures 108a and 108b is perpendicular to the longitudinal direction of the fins 106a and 106b. In some embodiments, each of the dummy gate structures 108a and 108b will be replaced with a replacement gate structure in a gate-last process.

Each of the dummy gate structures 108a and 108b includes a dummy gate dielectric layer 107 and a dummy gate electrode layer 109 over the dummy gate dielectric layer 107. In some embodiments, the dummy gate electrode layer 109 is made of poly-silicon. The dummy gate dielectric layer 107 may be made of silicon oxide, silicon nitride, silicon oxynitride or another low dielectric constant (low-k) dielectric material. The dummy gate dielectric layers 107 and the dummy gate electrode layers 109 are formed independently using a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD). Then, those deposited layers of the dummy gate dielectric layers 107 and the dummy gate electrode layers 109 are patterned into the dummy gate structures 108a and 108b using photolithography and etching processes. The etching process is anisotropic and may include a reactive ion etch (RIE), neutral beam etch (NBE), or another suitable etching process.

Gate spacers 110 are formed along the sidewalls of the dummy gate structures 108a and 108b and over the fins 106a and 106b. The gate spacers 110 are also formed on the isolation structures 104. The gate spacers 110 may be formed by conformally depositing one or more gate spacer material layers and anisotropically etching the one or more gate spacer material layers. The one or more gate spacer material layers may include silicon oxide ($SiO_2$), silicon nitride (SiN or $Si_3N_4$), silicon oxynitride (SiON), silicon carbon nitride (SiCN), or a combination thereof, and may be deposited by chemical vapor deposition (CVD), atomic layer deposition (ALD) or another deposition process. The etching process may include a RIE, NBE, or another etching process.

According to embodiments of the disclosure, before forming an air-gap spacer, the gate spacer 110 includes a disposable spacer that is a main portion of the gate spacer 110 and is formed over the other portions of the gate spacer 110. In some embodiments, the material of the disposable spacer includes an oxide-like material, such as silicon oxide ($SiO_2$), silicon oxynitride (SiON) or silicon oxycarbonitride (SiOCN). The disposable spacer of the gate spacer 110 will be removed using an etching process to form an air-gap spacer in following process steps. Details of the processes for forming the air-gap spacer are described below in reference to the cross-sectional views shown in FIGS. 2A to 11C.

Source and drain regions 112 are formed in active areas of the fins 106a and 106b, at opposite sides of the dummy gate structure 108a and at opposite sides of the dummy gate structure 108b, as shown in FIG. 1 in accordance with some embodiments. Some source and drain regions 112 may be shared between two neighboring transistors, such as through coalescing the regions by epitaxial growth. For example, the neighboring FinFETs with the shared source and drain regions may be implemented as two functional transistors. Other configurations in other examples may implement other numbers of functional transistors.

In some embodiments, the source and drain regions 112 are formed by implanting dopants into the active regions of the fins 106a and 106b using the dummy gate structures 108a and 108b and the gate spacers 110 as a mask. The source and drain regions 112 may be doped with suitable dopants such as p-type or n-type dopants which depend on the designed requirement of the FinFETs. Exemplary dopants may be, for example boron for a p-type FinFET, and phosphorus or arsenic for an n-type FinFET, although other dopants may be used.

In some embodiments, the source and drain regions 112 are epitaxial source and drain structures. The epitaxial source and drain structures may be formed by recessing the active areas of the fins 106a and 106b using the dummy gate structures and the gate spacers 110 as a mask, and then the epitaxial source and drain structures are epitaxially grown in the recesses. The active areas of the fins 106a and 106b may be recessed using an etching process. The etching process may be isotropic or anisotropic, or may be selective with respect to one or more crystalline planes of the material of the fins 106a and 106b. Hence, the recesses can have various cross-sectional profiles based on the etching process implemented. The etching process may be a dry etching process, such as a RIE, NBE, or the like, or a wet etching process, such as using tetramethylammonium hydroxide (TMAH), ammonium hydroxide ($NH_4OH$), or another etchant.

The epitaxial source and drain structures may include silicon germanium ($Si_xGe_{1-x}$, where x can be between approximately 0 and 1), silicon carbide, silicon phosphorus, germanium, an III-V compound semiconductor, an II-VI compound semiconductor, or another epitaxial semiconductor. For example, the materials of an III-V compound semiconductor may include InAs, AlAs, GaAs, InP, GaN, InGaAs, InAlAs, GaSb, AlSb, AlP or GaP. The epitaxial source and drain structures may be formed by metal-organic CVD (MOCVD), molecular beam epitaxy (MBE), liquid phase epitaxy (LPE), vapor phase epitaxy (VPE), selective epitaxial growth (SEG), or a combination thereof. Each of the epitaxial source and drain structures has several facets. The epitaxial source and drain structures may be doped by in-situ doping during the epitaxial growth and/or by implantation after the epitaxial growth. Hence, the source and drain regions 112 may be formed by epitaxial growth, and possibly with implantation, at opposite sides of the dummy gate structures 108a and 108b.

FIG. 1 illustrates a reference cross-section along line A-A that is used in FIGS. 2A, 3, 4, 5, 6A, 7A, 8A, 9A, 10A and 11A. Line A-A is on a plane that is perpendicular to the dummy gate structure 108a and along a channel region in the fin 106a between the opposing source and drain regions 112. FIG. 1 also illustrates a reference cross-section along line B-B that is used in FIGS. 2B, 6B, 7B, 8B, 9B, 10B and 11B. Line B-B is on a plane along the dummy gate structure 108a over two neighboring fins 106a and 106b. Moreover, FIG. 1 illustrates a reference cross-section along line C-C that is used in FIGS. 7C, 9C and 11C. Line C-C is on a plane that is perpendicular to the dummy gate structure 108a and on the isolation structure 104 between two neighboring fins 106a and 106b. In FIG. 1, for ease of depicting the figure, some components or features (for example, a contact etch stop layer and an interlayer dielectric layer) illustrated in the following figures are omitted to avoid obscuring other components or features. In addition, the dummy gate structure 108a is replaced with a replacement gate structure 120a, as shown in FIGS. 2A to 12 in accordance with some embodiments. Also, the dummy gate structure 108b is replaced with another replacement gate structure. The replacement gate structure 120a includes a high dielectric constant (high-k) gate dielectric layer 122 and a metal gate electrode layer 124. Details of the materials and processes for forming the replacement gate structure 120a are described below.

Figure 2A:
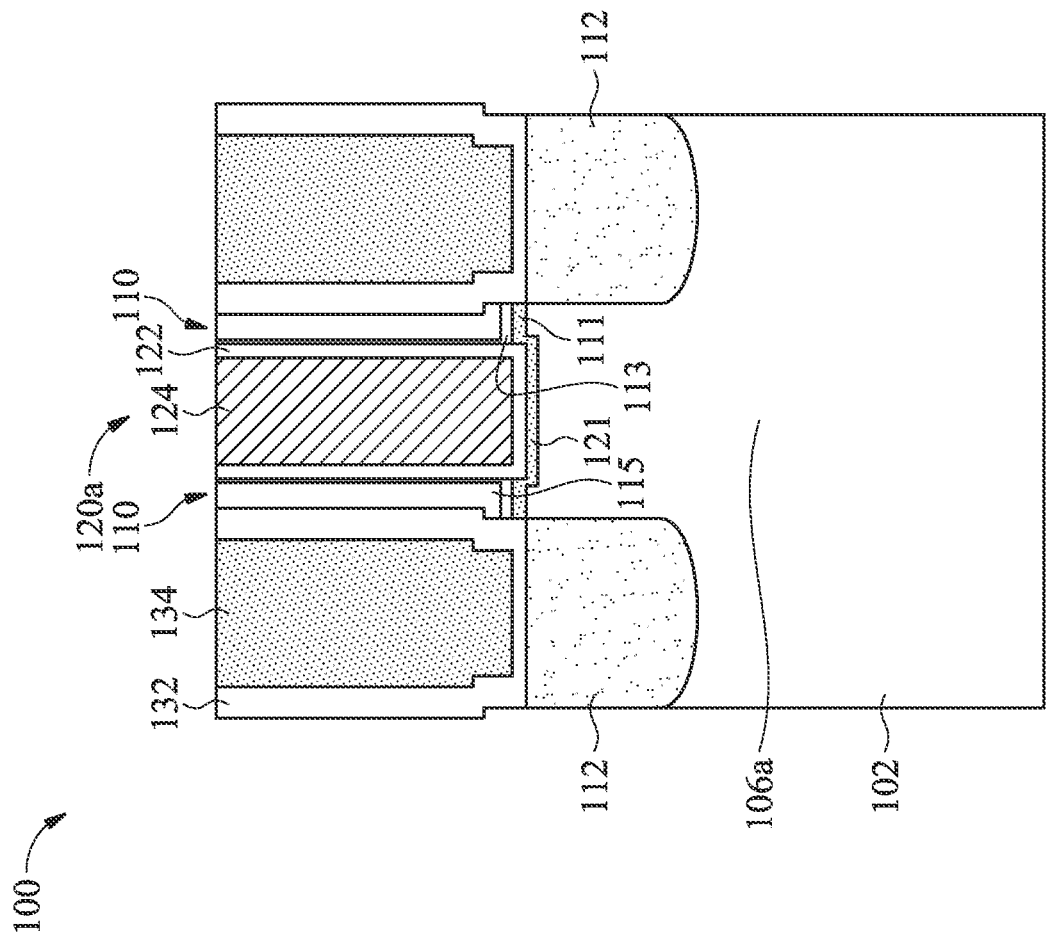
FIGS. 2A, 3, 4, 5, 6A, 7A, 8A, 9A, 10A, 11A and 12 show cross-sectional views of respective intermediate structures at various stages of an exemplary method for fabricating a semiconductor device taken along line A-A in FIG. 1, in accordance with some embodiments.

FIG. 2A illustrates a cross-sectional view of an intermediate structure at one stage of fabricating a semiconductor device taken along line A-A in FIG. 1, in accordance with some embodiments. In a gate-last process, before replacing the dummy gate structure 108a with the replacement gate structure 120a, a contact etch stop layer (CESL) 132 is conformally deposited along the sidewalls of the gate spacers 110, and on the active areas of the fin 106a such as the source and drain regions 112. The contact etch stop layer 132 is also deposited on the isolation regions 104 while a cross section is taken along line C-C in FIG. 1.

An interlayer dielectric (ILD) layer 134 is deposited on the contact etch stop layer 132 and around the gate spacers 110. Generally, the contact etch stop layer 132 can provide a mechanism to stop an etching process when forming contacts on the source and drain regions 112. The contact etch stop layer 132 may be formed of a dielectric material having a different etch selectivity from the adjacent ILD layer 134. The material of the contact etch stop layer 132 may include silicon nitride (SiN or $Si_3N_4$), silicon carbon nitride (SiCN) or a combination thereof, and may be deposited by CVD, PECVD, ALD, or another deposition process. In some examples, the contact etch stop layer 132 has a thickness in a range from about 2 nm to about 5 nm. The material of the ILD layer 134 may include silicon dioxide or a low-k dielectric material (e.g., a material having a dielectric constant lower than that of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD layer 134 may be deposited by spin-on coating, CVD, Flowable CVD (FCVD), PECVD, PVD, or another deposition process.

Afterwards, a planarization process, for example a chemical mechanical polishing (CMP) process, is performed on the ILD layer 134 and the contact etch stop layer 132 to expose the dummy gate structure 108a and the gate spacers 110. After the planarization process, the top surfaces of the ILD layer 134 and the contact etch stop layer 132 are coplanar with the top surfaces of the dummy gate structure 108a and the gate spacers 110. Next, the dummy gate structure 108a is removed in an etching process to form a space between the gate spacers 110. The dummy gate electrode layer 109 and the dummy gate dielectric layer 107 may be removed in one or more etching processes to form the space. The etching processes may be a dry etching process such as a RIE or NBE process, a wet etching process, or another etching process.

In some embodiments, the dummy gate dielectric layer 107 is partially removed to remain a portion that is used as an interfacial layer (IL) 121 for the replacement gate structure 120a. Moreover, a portion 111 of the dummy gate dielectric layer 107 remains under the gate spacer 110. In some embodiments, the gate spacer 110 includes an inner sidewall spacer 113 and a disposable spacer 115 over the inner sidewall spacer 113. The remaining portion 111 of the dummy gate dielectric layer 107 is disposed under the inner sidewall spacer 113. The material of the inner sidewall spacer 113 includes silicon carbon nitride (SiCN), silicon nitride (SiN or $Si_3N_4$) or a combination thereof, and may be deposited by CVD, PECVD, ALD, or another deposition process. The material of the disposable spacer 115 includes silicon oxide ($SiO_2$), silicon oxynitride (SiON) or a combination thereof, and may be deposited by CVD, PECVD, ALD, or another deposition process. In some examples, the disposable spacer 115 has a thickness in a range from about 2 nm to about 3 nm. The inner sidewall spacer 113 has a thickness in a range from about 1nm to about 2 nm. The deposited material layers of the disposable spacer 115 and the inner sidewall spacer 113 are etched to form the gate spacer 110 using RIE, NBE, or another etching process. In addition, the remaining portion of the dummy gate dielectric layer 107 that is used as the interfacial layer (IL) 121 may be further extended downward by a thermal or chemical oxidation process, such that the bottom surface of the interfacial layer 121 is lower than that of the remaining portion 111. In other examples, the interfacial layer 121 may be omitted.

Figure 2B:
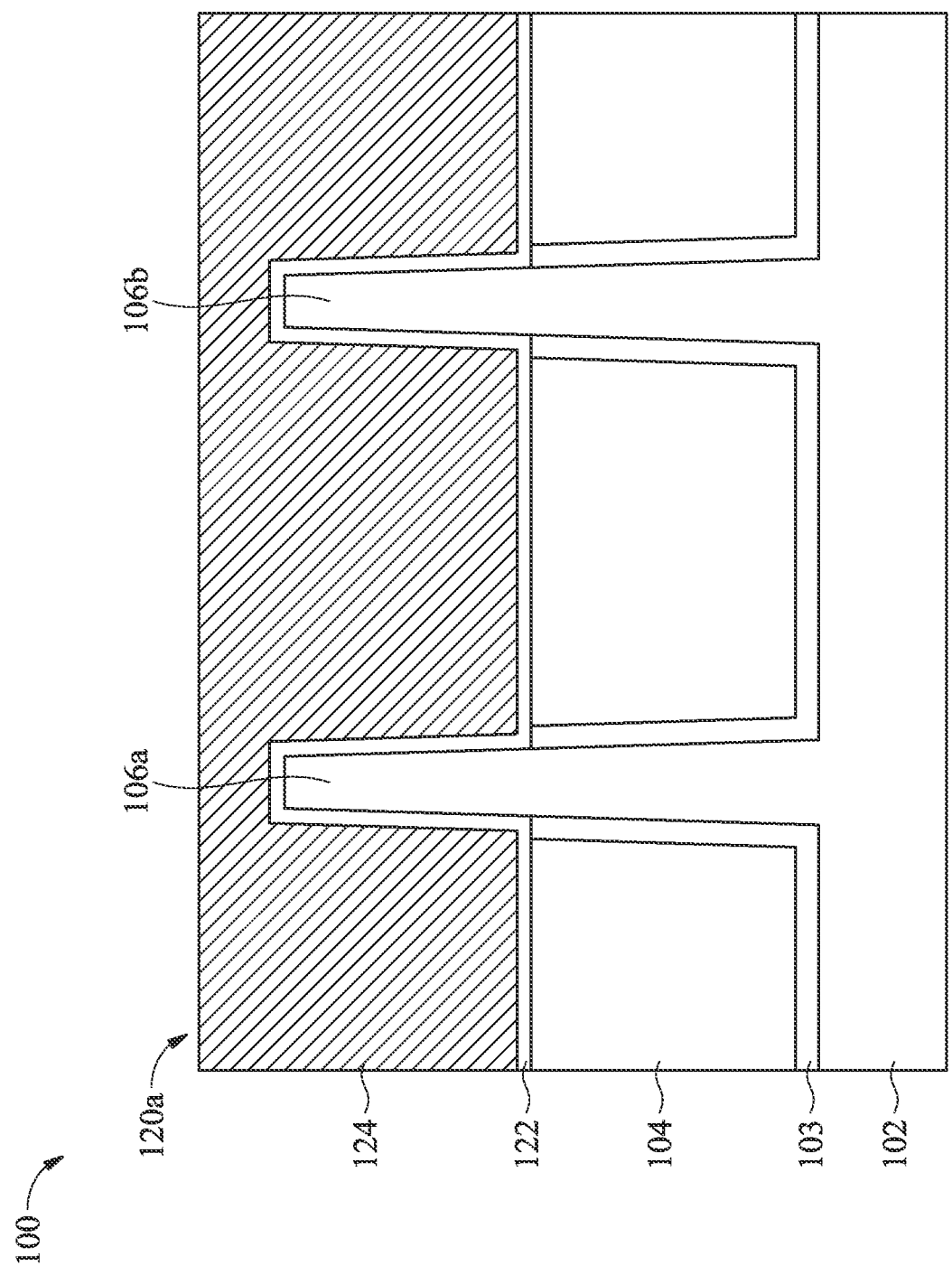
FIGS. 2B, 6B, 7B, 8B, 9B, 10B and 11B show cross-sectional views of intermediate structures at several stages of an exemplary method for fabricating a semiconductor device taken along line B-B in FIG. 1, in accordance with some embodiments.

Afterwards, the replacement gate structure 120a is formed in the space between the gate spacers 110, as shown in FIG. 2A in accordance with some embodiments. The replacement gate structure 120a includes a high dielectric constant (high-k) gate dielectric layer 122 that is conformally deposited on the sidewalls and the bottom surface of the space. For example, the gate dielectric layer 122 is deposited over the interfacial layer 121, along the inner sidewalls of the gate spacers 110, and over top surfaces of the gate spacers 110, the contact etch stop layer 132, and the ILD layer 134. FIG. 2B illustrates a cross-sectional view of an intermediate structure at one stage of fabricating a semiconductor device taken along line B-B in FIG. 1, in accordance with some embodiments. The gate dielectric layer 122 is also conformally deposited along the sidewalls and on the top surfaces of the fins 106a and 106b, and on the isolation structures 104, as shown in FIG. 2B in accordance with some embodiments.

The gate dielectric layer 122 includes silicon oxide, silicon nitride, a high-k dielectric material, multilayers thereof, or other dielectric material. The high-k dielectric material may have a k-value greater than about 7.0. The high-k dielectric material may include a metal oxide of or a metal silicate of Hf, Al, Zr, La, Mg, Ba, Ti, Pb, or a combination thereof. The gate dielectric layer 122 may be deposited by ALD, PECVD, molecular-beam deposition (MBD), or another deposition process. In some examples, the gate dielectric layer 122 has a thickness in a range from about 15 Å to about 25 Å.

The replacement gate structure 120a also includes a gate electrode layer 124 over the gate dielectric layer 122. In some embodiments, the gate electrode layer 124 includes multiple layers, such as a capping layer, a barrier layer, a work-function tuning layer and a metal fill material. The capping layer, the barrier layer and the work-function tuning layer are conformally deposited over the gate dielectric layer 122 in sequence. The capping layer may include titanium nitride, titanium-silicon nitride, titanium-carbon nitride, titanium-aluminum nitride, tantalum nitride, tantalum-silicon nitride, tantalum-carbon nitride, aluminum nitride, or a combination thereof, and may be deposited by ALD, PECVD, MBD, or another deposition process. In some examples, the capping layer may have a thickness in a range from about 5 Å to about 25 Å. The barrier layer may include tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, or a combination thereof, and may be deposited by ALD, PECVD, MBD, or another deposition process. In some examples, the barrier layer may have a thickness in a range from about 5 Å to about 25 Å.

The work-function tuning layer may include titanium aluminum carbide (TiAlC), a titanium aluminum alloy (TiAl), tantalum-aluminum carbide, or a combination thereof, and may be deposited by ALD, PECVD, MBD, or another deposition process. In some examples, the work-function tuning layer may have a thickness in a range from about 10 Å to about 60 Å. Other examples may have various other configurations of work-function tuning layers to achieve a desired performance of the FinFET to be formed. For example, any different number of work-function layers having various materials and/or thicknesses may be used. In some instances, for example, a p-type FinFET and an n-type FinFET may have different work-function tuning layers. The metal fill material is deposited to fill the remaining space over the work-function tuning layer. The metal fill material may include tungsten, cobalt, ruthenium, aluminum, copper, multi-layers thereof, or a combination thereof. The metal fill material may be deposited by ALD, PECVD, MBD, PVD, or another deposition process.

In addition, excess portions of the gate dielectric layer 122 and the gate electrode layer 124 over the top surfaces of the ILD layer 134, the contact etch stop layer 132 and the gate spacers 110 may be removed in a planarization process, such as a CMP process. The result of the planarization process is illustrated as the structure of FIG. 2A in accordance with some embodiments. The top surface of the replacement gate structure 120a is coplanar with the top surfaces of the ILD layer 134, the contact etch stop layer 132 and the gate spacers 110.

Figure 3:
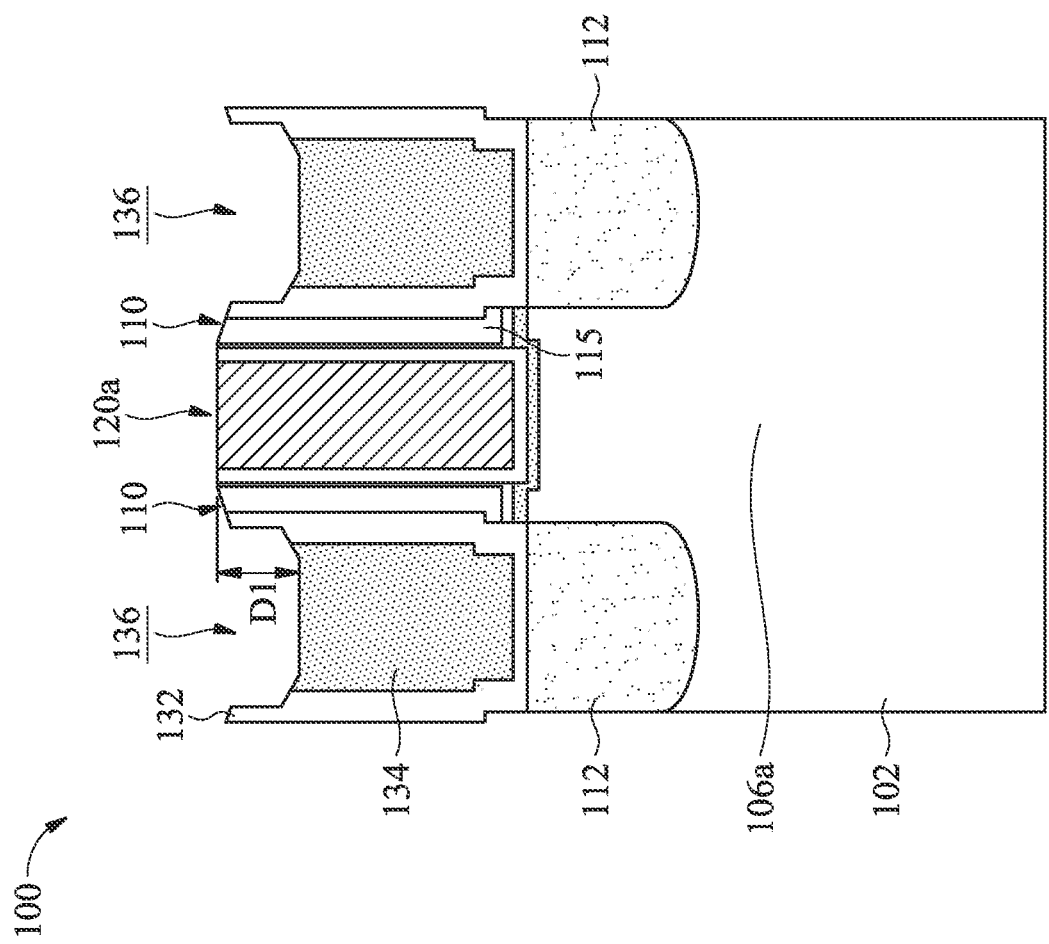

FIG. 3 illustrates a cross-sectional view of an intermediate structure at one stage of fabricating a semiconductor device following FIG. 2A, which is taken along line A-A in FIG. 1, in accordance with some embodiments. In this stage, a cross-sectional view taken along line B-B in FIG. 1 is the same as that of FIG. 2B. The upper portion of the ILD layer 134 is removed using an etching process to form a recess 136, as shown in FIG. 3 in accordance with some embodiments. The recess 136 has a depth D1 below the top surface of the replacement gate structure 120a. In some examples, the depth D1 is in a range from about 10 nm to about 30 nm. In the etching process, the material of the ILD layer 134 has a high etch selectivity while compared with the materials of the replacement gate structure 120a, the contact etch stop layer 132 and the gate spacer 110. Moreover, the contact etch stop layer 132 and the gate spacer 110 may be slightly etched. The etching process may be a dry etching process, such as a remote plasma etching process that may use a gas mixture of HF-based gas, $N_2$ and $NH_3$ to generate radicals by remote plasma source (RPS). Alternatively, the etching process may be a wet etching process using a chemical etchant that has a high selectivity to the material of the ILD layer 134 while compared with the materials of the replacement gate structure 120a and the disposable spacer 115. The chemical etchant is for example hydrofluoric acid (HF).

Figure 4:
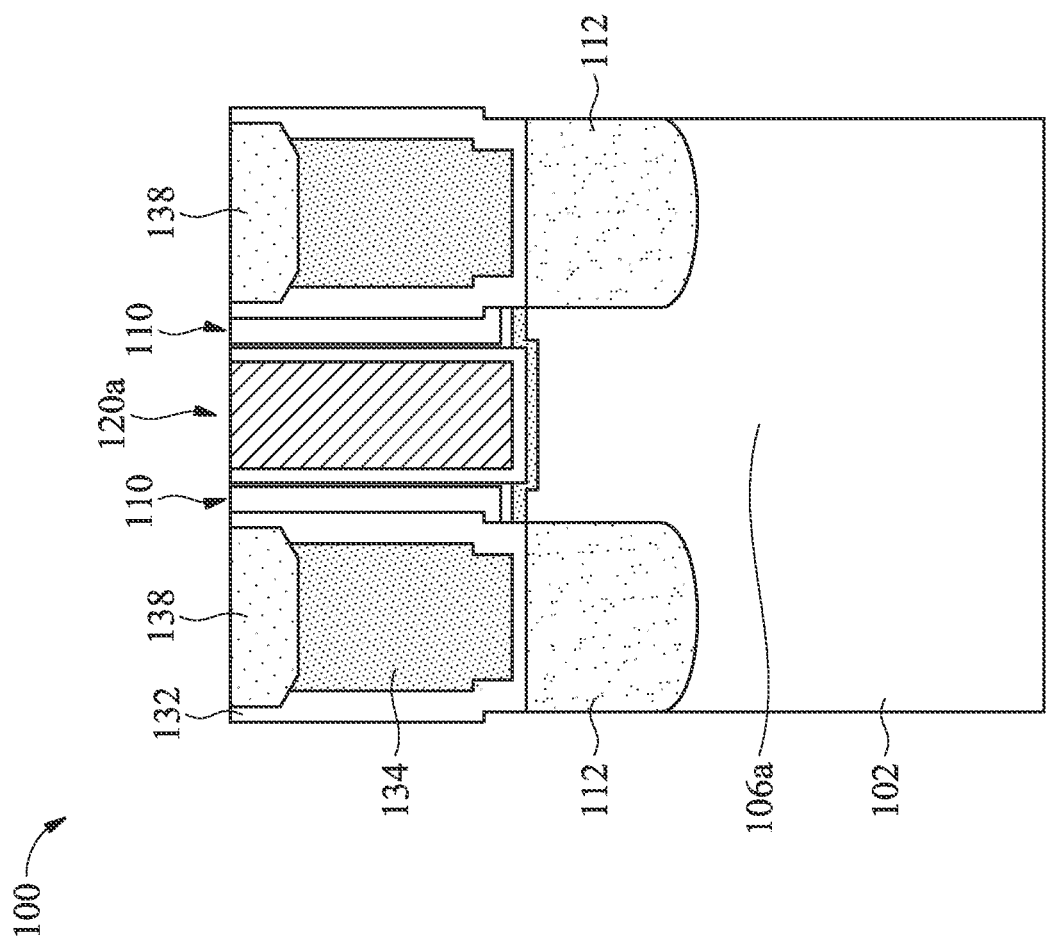

FIG. 4 illustrates a cross-sectional view of an intermediate structure at one stage of fabricating a semiconductor device following FIG. 3, which is taken along line A-A in FIG. 1, in accordance with some embodiments. In this stage, a cross-sectional view taken along line B-B in FIG. 1 is the same as that of FIG. 2B. A hard mask 138 is formed in the recess 136 of FIG. 3 and on the recessed ILD layer 134. The material of the hard mask 138 may include metal oxide, silicon oxycarbide (SiOC), silicon carbon nitride (SiCN), silicon nitride (SiN) or silicon oxycarbon nitride (SiOCN), and is selected based on the material used in the disposable spacer 115. The material of the disposable spacer 115 has an etch selectivity that is greater than about 150 to the material of the hard mask 138 in the etching process that removes the disposable spacer 115. The hard mask 138 may be formed by depositing the material layer of the hard mask 138 and then using a planarization process, for example CMP process, to remove excess portions of the deposited material layer over the replacement gate structure 120a, the gate spacers 110 and the contact etch stop layer 132. Thereafter, the top surface of the hard mask 138 is coplanar with the top surfaces of the replacement gate structure 120a, the gate spacers 110 and the contact etch stop layer 132.

Figure 5:
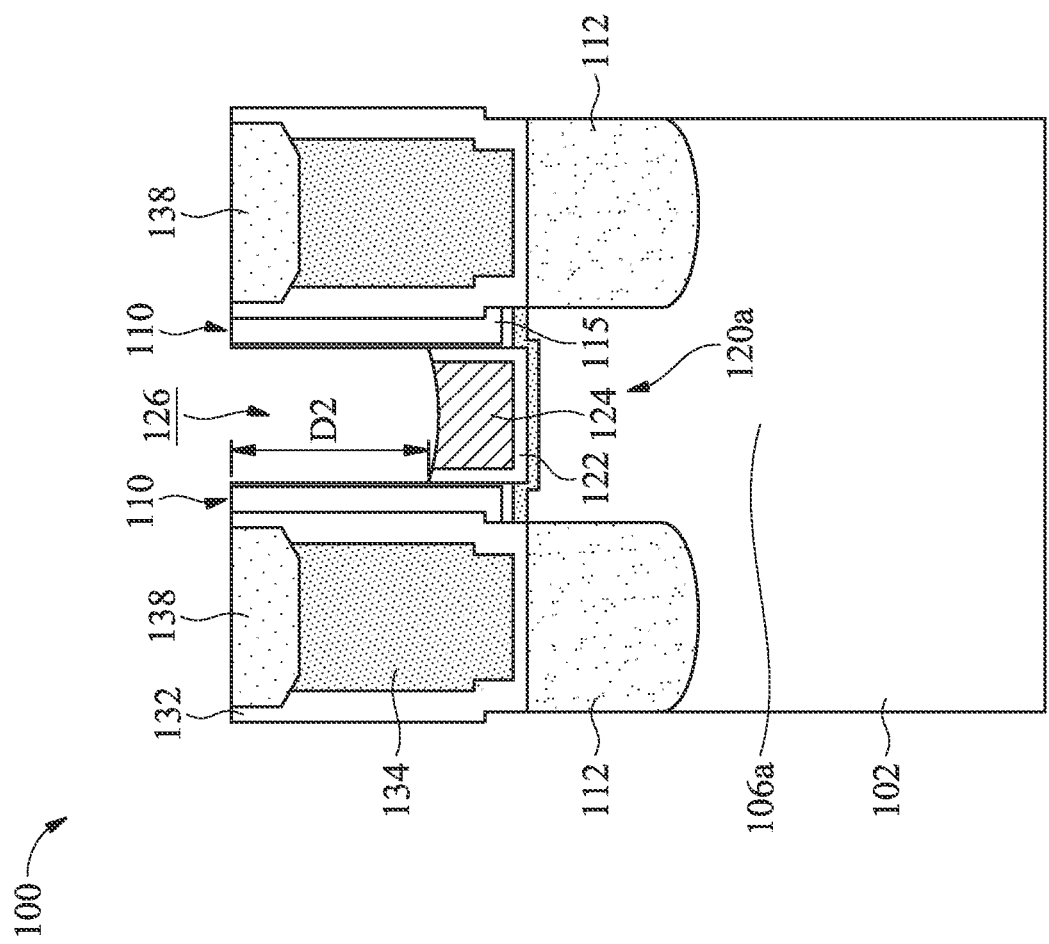

FIG. 5 illustrates a cross-sectional view of an intermediate structure at one stage of fabricating a semiconductor device following FIG. 4, which is taken along line A-A in FIG. 1, in accordance with some embodiments. The replacement gate structure 120a is etched back to form a space 126 between the disposable spacers 115. The space 126 has a depth D2 below the top surface of the hard mask 138. In some examples, the depth D2 is in a range from about 50 nm to about 60 nm. Both the gate dielectric layer 122 and the gate electrode layer 124 are etched back. The upper portion of the replacement gate structure 120a of FIG. 4 is removed in an etching process. The material of the replacement gate structure 120a has an etch selectivity that is greater than about 5 to the material of the hard mask 138 in the etching process of removing the upper portion of the replacement gate structure 120a. In some examples, the etch selectivity greater than about 5 can avoid or reduce gate height loss. During the etching process used for etching back the replacement gate structure 120a, the hard mask 138 can protect the ILD layer 134. The etching process may be a dry etching process, such as a plasma etching process using high-density chlorine-containing plasmas. The etching process is anisotropic. In this stage, a cross-sectional view taken along line B-B in FIG. 1 is similar to the structure of FIG. 2B, except that the replacement gate structure 120a is etched back to have a height that is lower than the height of the replacement gate structure 120a in FIG. 2B.

Figure 6A:
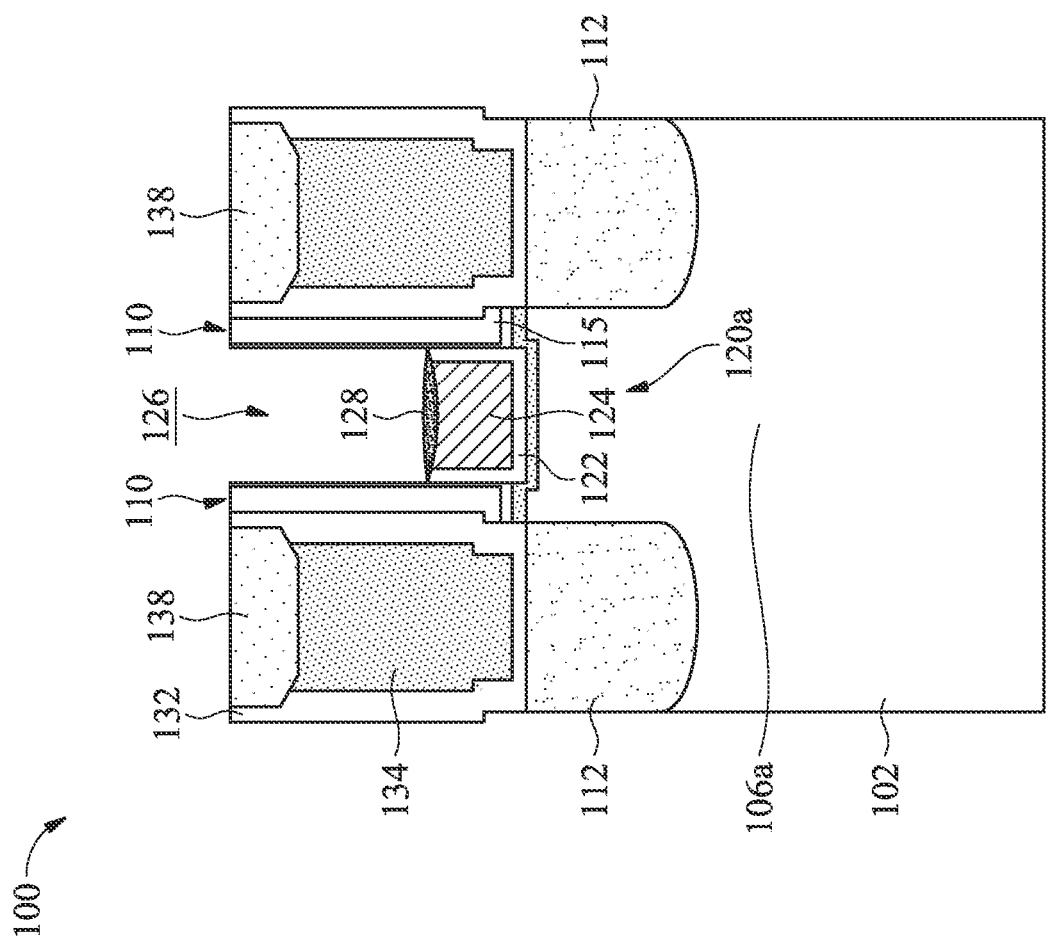
Figure 6B:
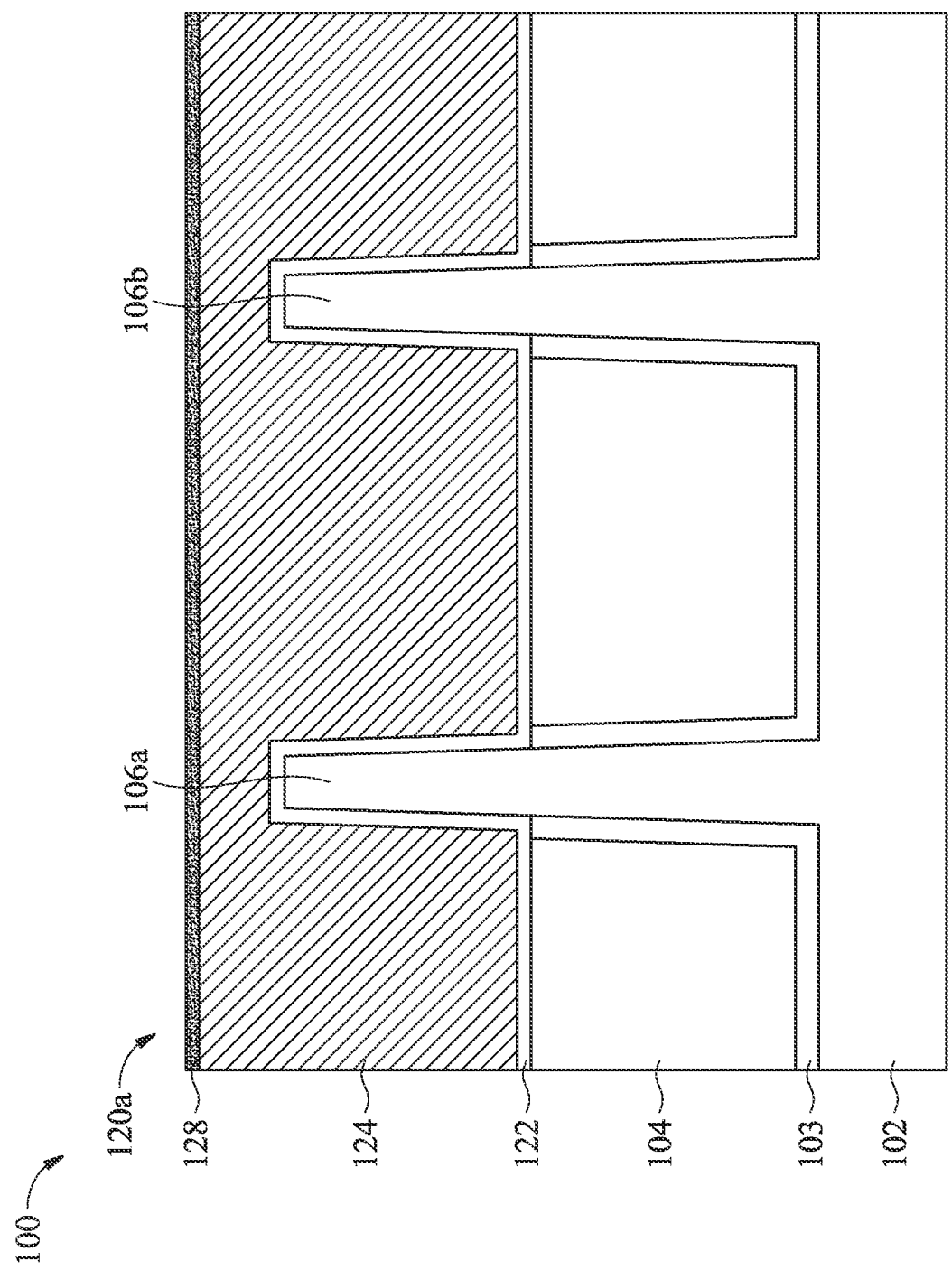

FIG. 6A illustrates a cross-sectional view of an intermediate structure at one stage of fabricating a semiconductor device following FIG. 5, which is taken along line A-A in FIG. 1, in accordance with some embodiments. FIG. 6B illustrates a cross-sectional view of the intermediate structure at this stage of fabricating a semiconductor device taken along line B-B in FIG. 1, in accordance with some embodiments. A metal cap layer 128 is selectively deposited on the etched-back replacement gate structure 120a of FIG. 5. The metal cap layer 128 is deposited on the gate electrode layer 124 and the gate dielectric layer 122, and may fill a concave surface of the etched-back replacement gate structure 120a, as shown in FIG. 6A in accordance with some embodiments. Also, the metal cap layer 128 is deposited on the gate electrode layer 124 while taken along line B-B in FIG. 1, as shown in FIG. 6B in accordance with some embodiments. In some embodiments, the metal cap layer 128 is a tungsten (W) layer that may be deposited using a fluorine-free tungsten-containing precursor, for example $W(CO)_6$, in a CVD, PECVD or ALD process. In some examples, the metal cap layer 128 has a thickness in a range from about 1nm to about 5 nm.

Figure 7A:
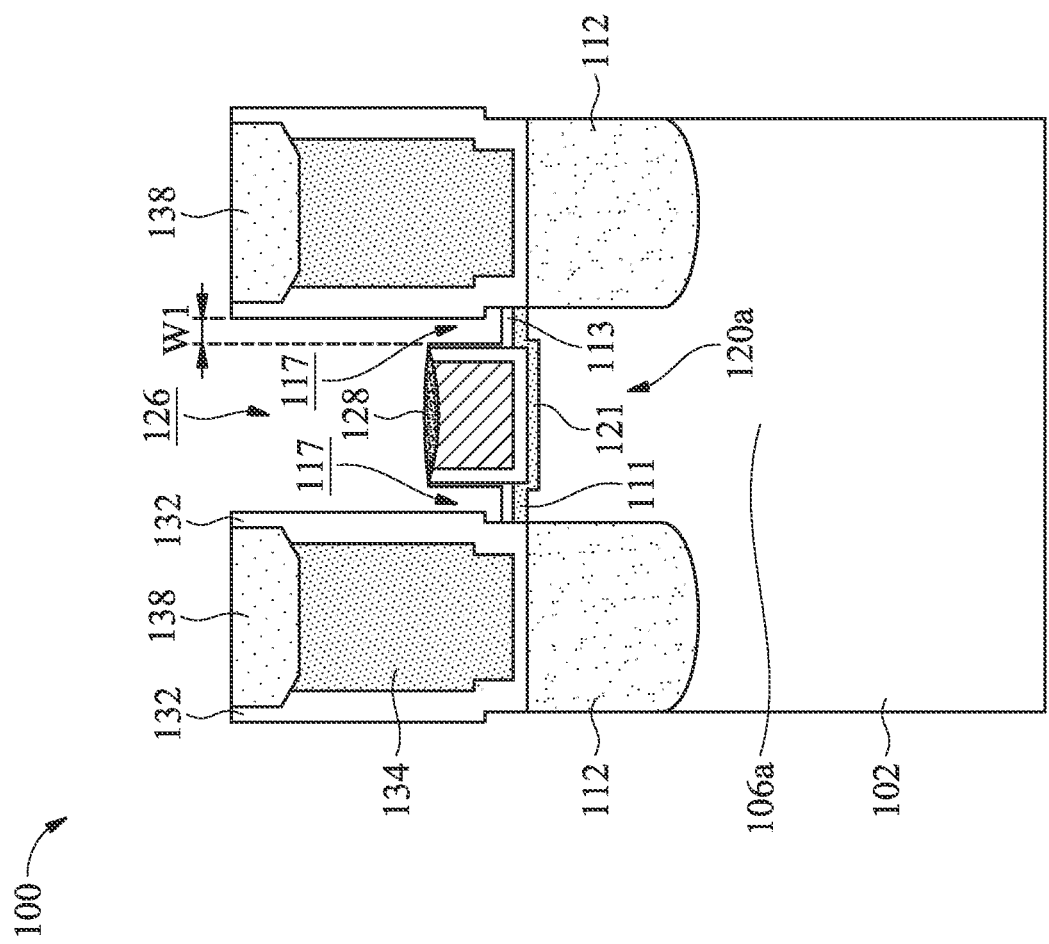

Most of the disposable spacer 115 is exposed through the space 126 above the etched-back replacement gate structure 120a, as shown in FIG. 6A in accordance with some embodiments. Next, the disposable spacer 115 is removed to form a trench 117 between the replacement gate structure 120a and the ILD layer 134, as shown in FIG. 7A in accordance with some embodiments, which is taken along line A-A in FIG. 1. In addition, the contact etch stop layer 132 is disposed between the trench 117 and the ILD layer 134. The disposable spacer 115 is selectively removed using an etching process, and a portion of the inner sidewall spacer 113 remains.

Moreover, the metal cap layer 128 can protect the replacement gate structure 120a during the etching process. The material of the disposable spacer 115 has an etch selectivity to the materials of the inner sidewall spacer 113, the contact etch stop layer 132, the hard mask 138, the replacement gate structure 120a and the source and drain regions 112 in the etching process. In some examples, the disposable spacer 115 has an etch selectivity that is greater than about 150. The etching process for removing the disposable spacer 115 is an isotropic etching process, such as a remote plasma etching process that may use a gas mixture of HF-based gas, $F_2$, $H_2O$, $O_2$, and $H_2$ to generate radicals by remote plasma source (RPS). Alternatively, the etching process may be a wet etching process that uses a Fluorine (F)-based chemical etchant having a high selectivity to the disposable spacer 115. The F-based chemical etchant is for example hydrofluoric acid (HF). In some examples, the trench 117 has a width W that is in a range from about 3 nm to about 5 nm.

Figure 7B:
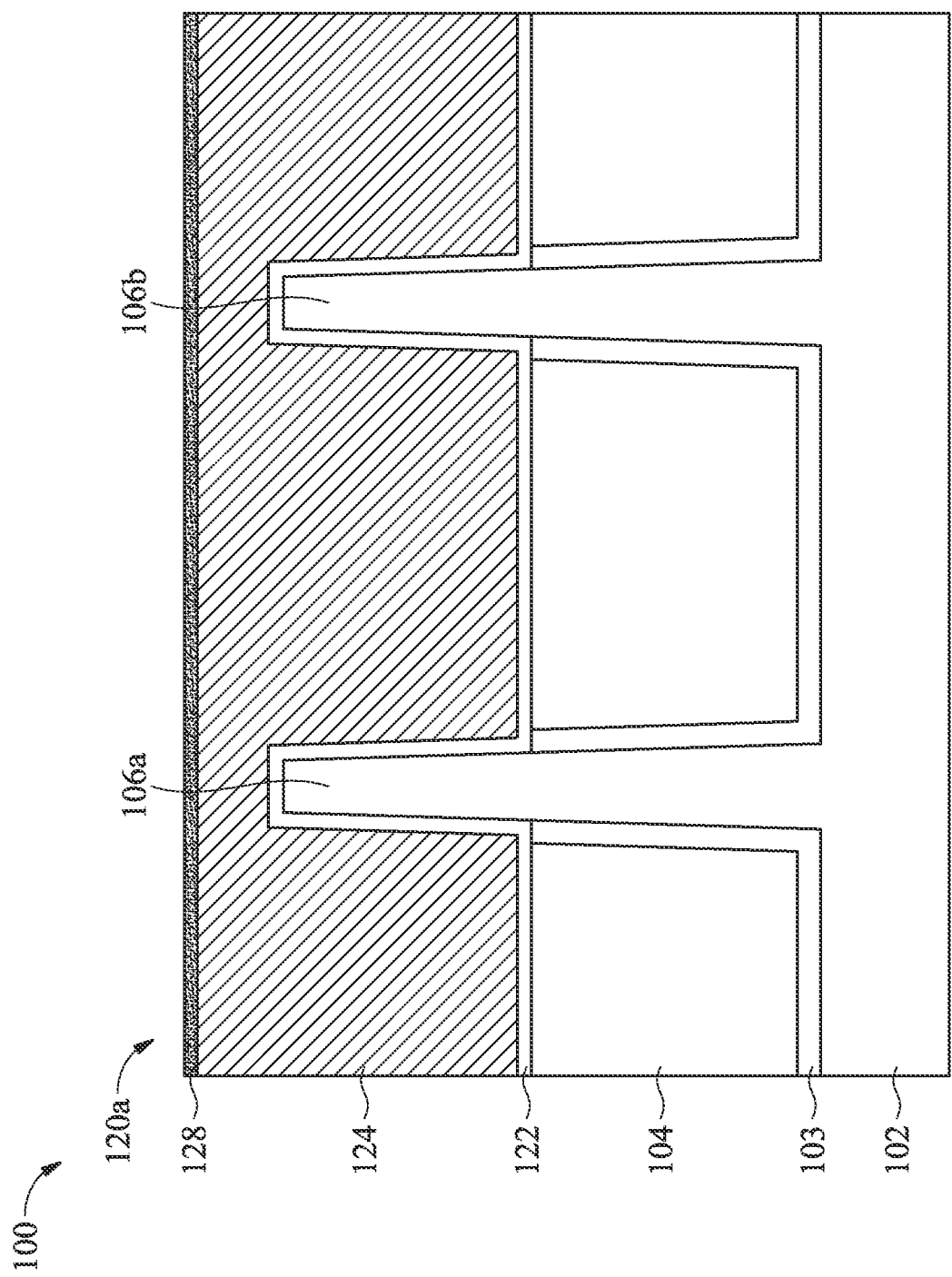

FIG. 7B illustrates a cross-sectional view of the intermediate structure of FIG. 7A at this stage of fabricating a semiconductor device taken along line B-B in FIG. 1, in accordance with some embodiments. The structure of FIG.

Figure 7C:
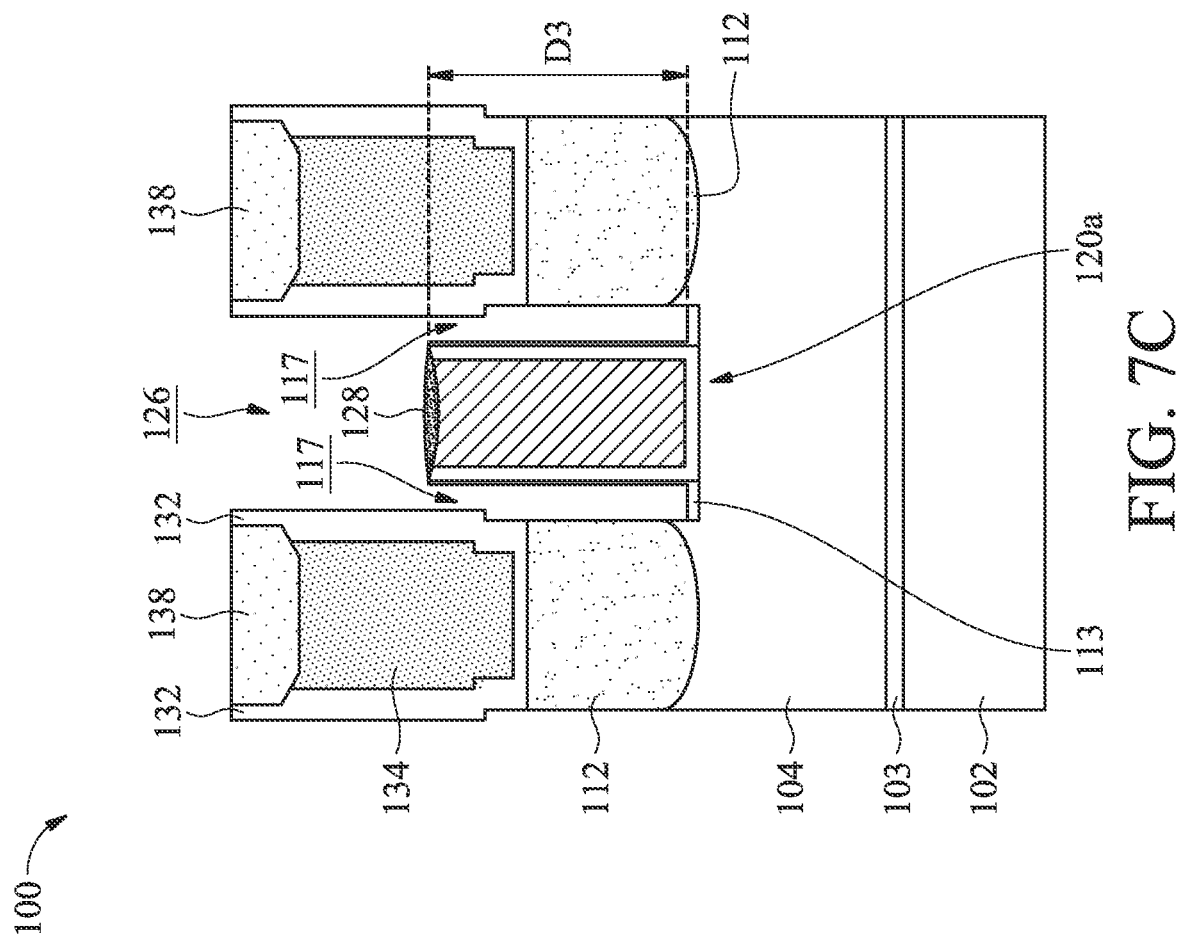
FIGS. 7C, 9C and 11C show cross-sectional views of intermediate structures at several stages of an exemplary method for fabricating a semiconductor device taken along line C-C in FIG. 1, in accordance with some embodiments.

7B is the same as that of FIG. 6B. FIG. 7C illustrates a cross-sectional view of the intermediate structure of FIG. 7A at this stage of fabricating a semiconductor device taken along line C-C in FIG. 1, in accordance with some embodiments. In some examples, the trench 117 has a depth D3 that is in a range from about 50 nm to about 70 nm in the cross-section taken along line C-C in FIG. 1.

Figure 8A:
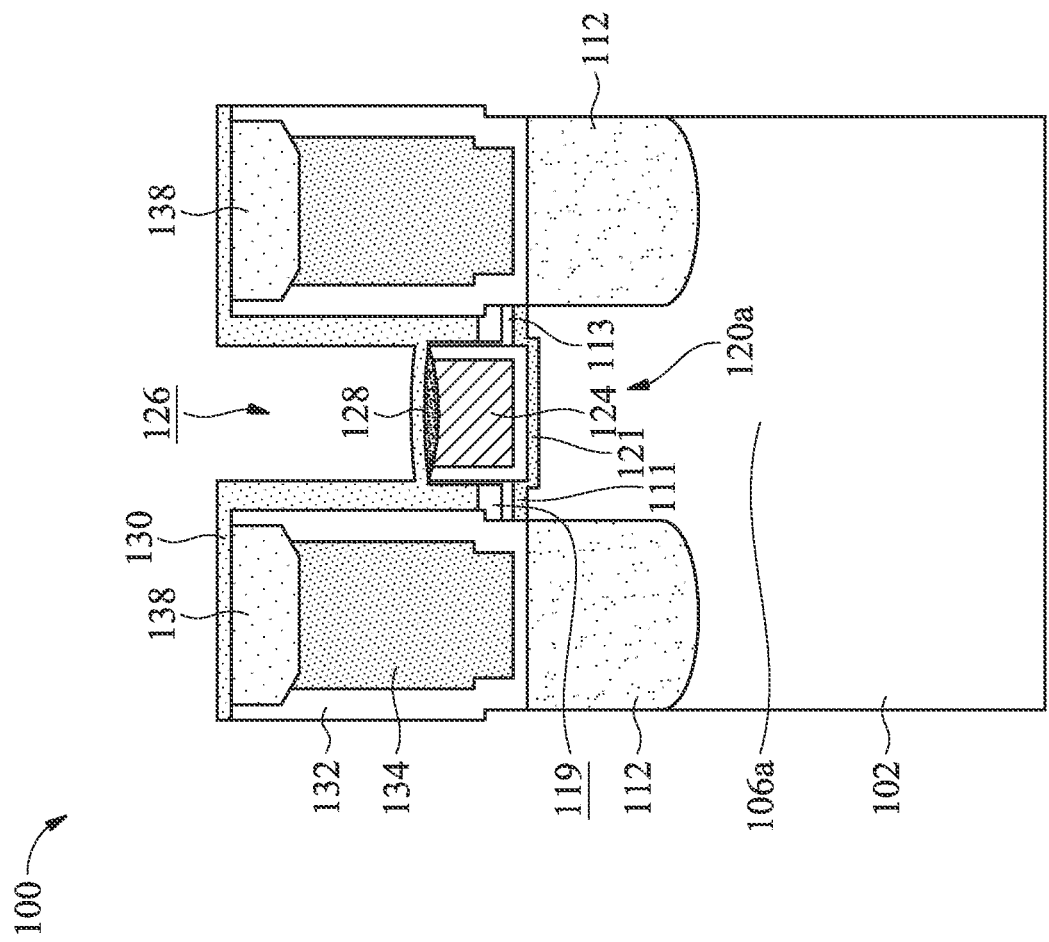

Afterwards, a sealing spacer material layer 130 is deposited on the structures of FIGS. 7A and 7B. The sealing spacer material layer 130 is conformally deposited on the hard mask 138, along the sidewall of the contact etch stop layer 132, and on the metal cap layer 128, as shown in FIG. 8A in accordance with some embodiments, which is taken along line A-A in FIG. 1. In some embodiments, the sealing spacer material layer 130 may extend into the trench 117 with a seal depth D4 to seal the trench 117 and to form an air-gap spacer 119. In some embodiments, the sealing spacer material layer 130 may not extend into the trench 117 to seal the trench 117 and to form an air-gap spacer 119. In some examples, the seal depth D4 is in a range from about 0 nm to less than the height of the replacement gate structure 120a, for example about 5 nm. The height of the replacement gate structure 120a is above the top surfaces of the source and drain regions 112. The lowest surface of the sealing spacer material layer 130 is above the top surfaces of the source and drain regions 112.

Figure 8B:
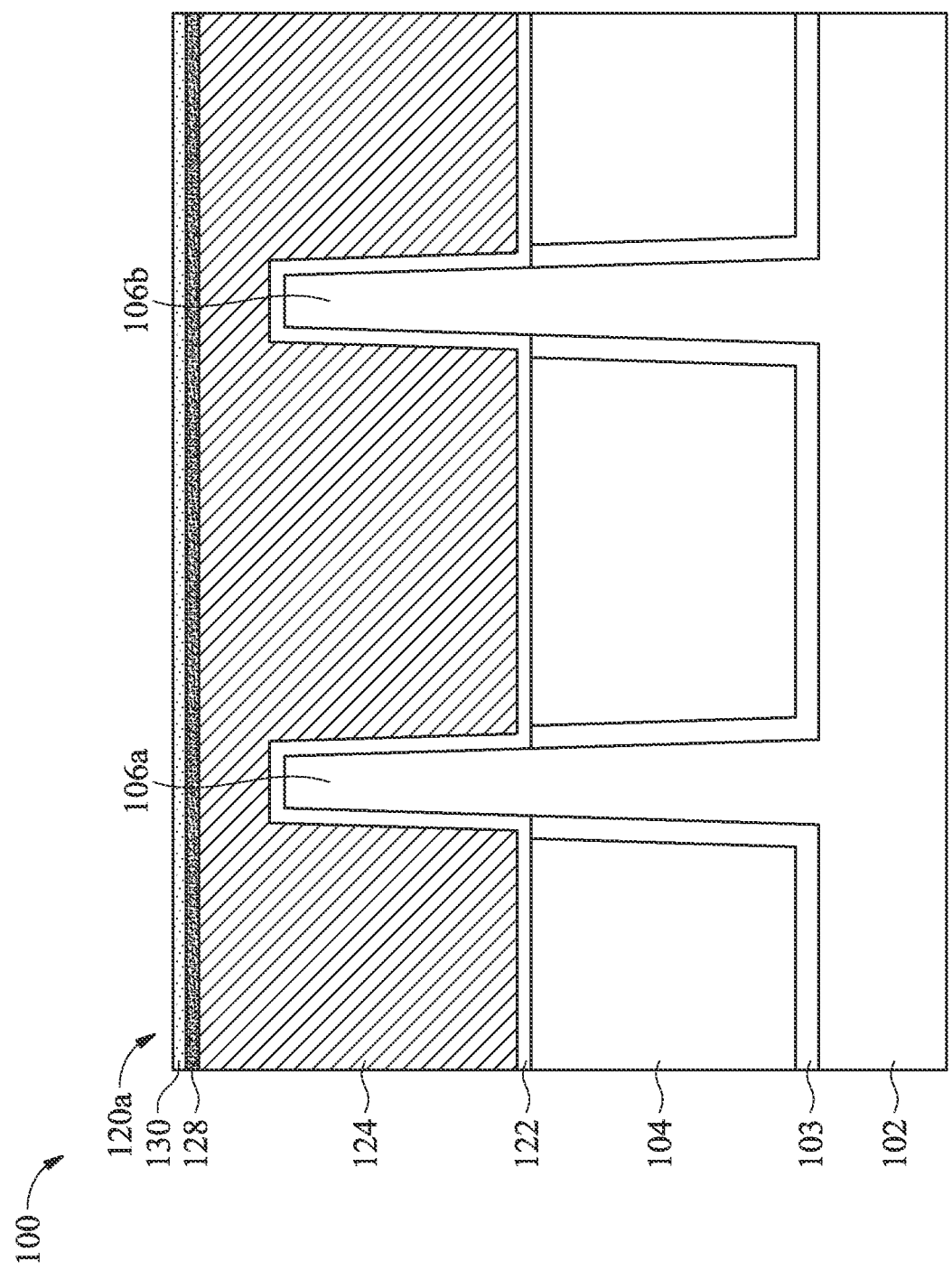

In some examples, after refilling the trench 117, the air-gap spacer 119 has a width in a range from about 1nm to about 4 nm. The width of the air-gap spacer 119 is greater than 20% of the distance between the gate dielectric layer 122 and the source or drain region 112 for performance tolerance of the FinFET. In some embodiments, the sealing spacer material layer 130 is made of a low-k dielectric material that has a k value lower than about 5. The low-k dielectric material of the sealing spacer material layer 130 is for example silicon oxycarbon (SiOC), silicon oxycarbon nitride (SiOCN), silicon oxynitride (SiON), or another low-k dielectric material. In some embodiments, the material of the sealing spacer material layer 130 includes SiN or SiCN. The sealing spacer material layer 130 may be deposited in a low-temperature (LT) deposition process, such as a CVD process performed at a temperature lower than 500° C. In some examples, the sealing spacer material layer 130 has a thickness in a range from about 6 nm to about 8 nm. In addition, the sealing spacer material layer 130 is deposited on the metal cap layer 128 over the replacement gate structure 120a, as shown in FIG. 8B in accordance with some embodiments, which is taken along line B-B in FIG. 1.

Figure 9A:
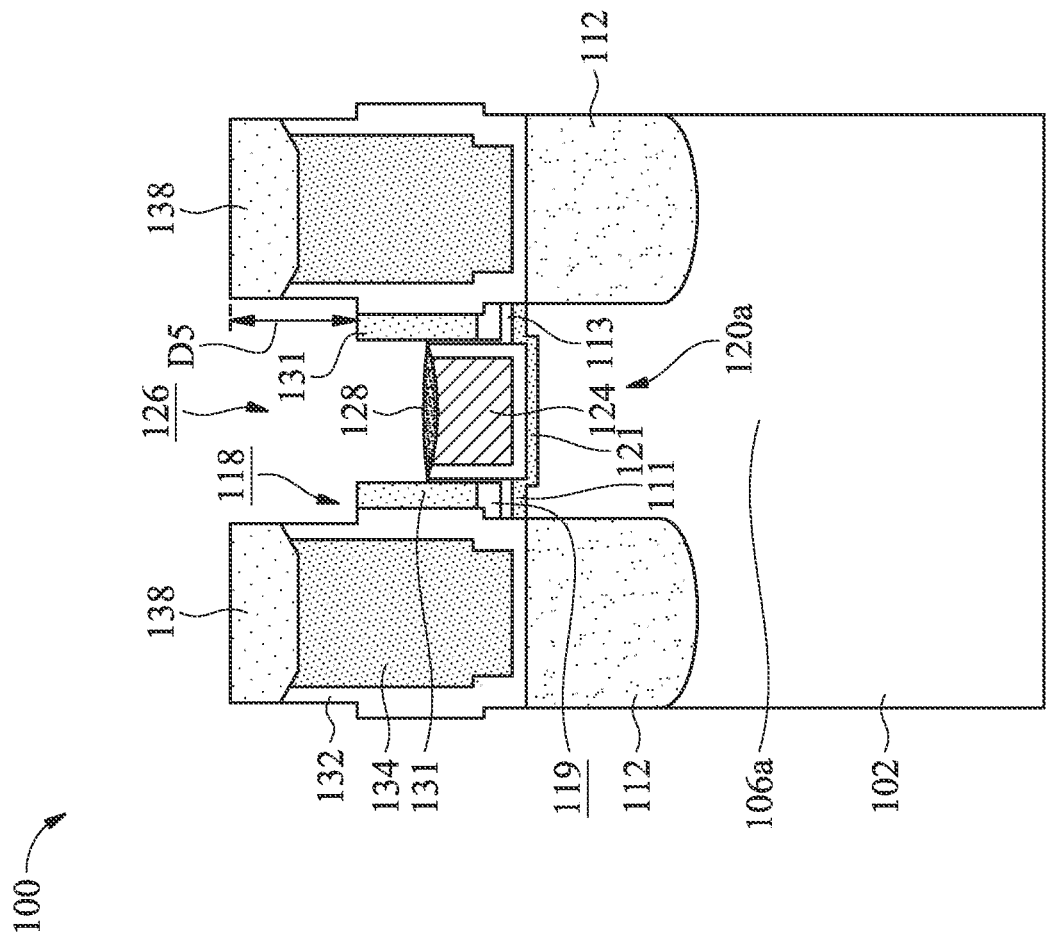

Next, the sealing spacer material layer 130 is pulled-back to form a sealing spacer 131, as shown in FIG. 9A in accordance with some embodiments, which is taken along line A-A in FIG. 1. The portions of the sealing spacer material layer 130 on the hard mask 138 and the metal cap layer 128 are removed. In addition, a portion of the sealing spacer material layer 130 on the upper sidewall of the contact etch stop layer 132 is removed to form a recess 118 above the sealing spacer 131. In some embodiments, the sealing spacer material layer 130 is pulled-back from the top surface of the hard mask 138 with a distance D5. In some examples, the distance D5 is in a range from about 30 nm to about 40 nm. The sealing spacer material layer 130 may be pulled-back using a plasma etching process. The material of the sealing spacer material layer 130 has an etch selectivity to the materials of the contact etch stop layer 132, the hard mask 138 and the replacement gate structure 120a in the plasma etching process. In some examples, the etch selectivity of the sealing spacer material layer 130 is greater than about 80.

Figure 9B:
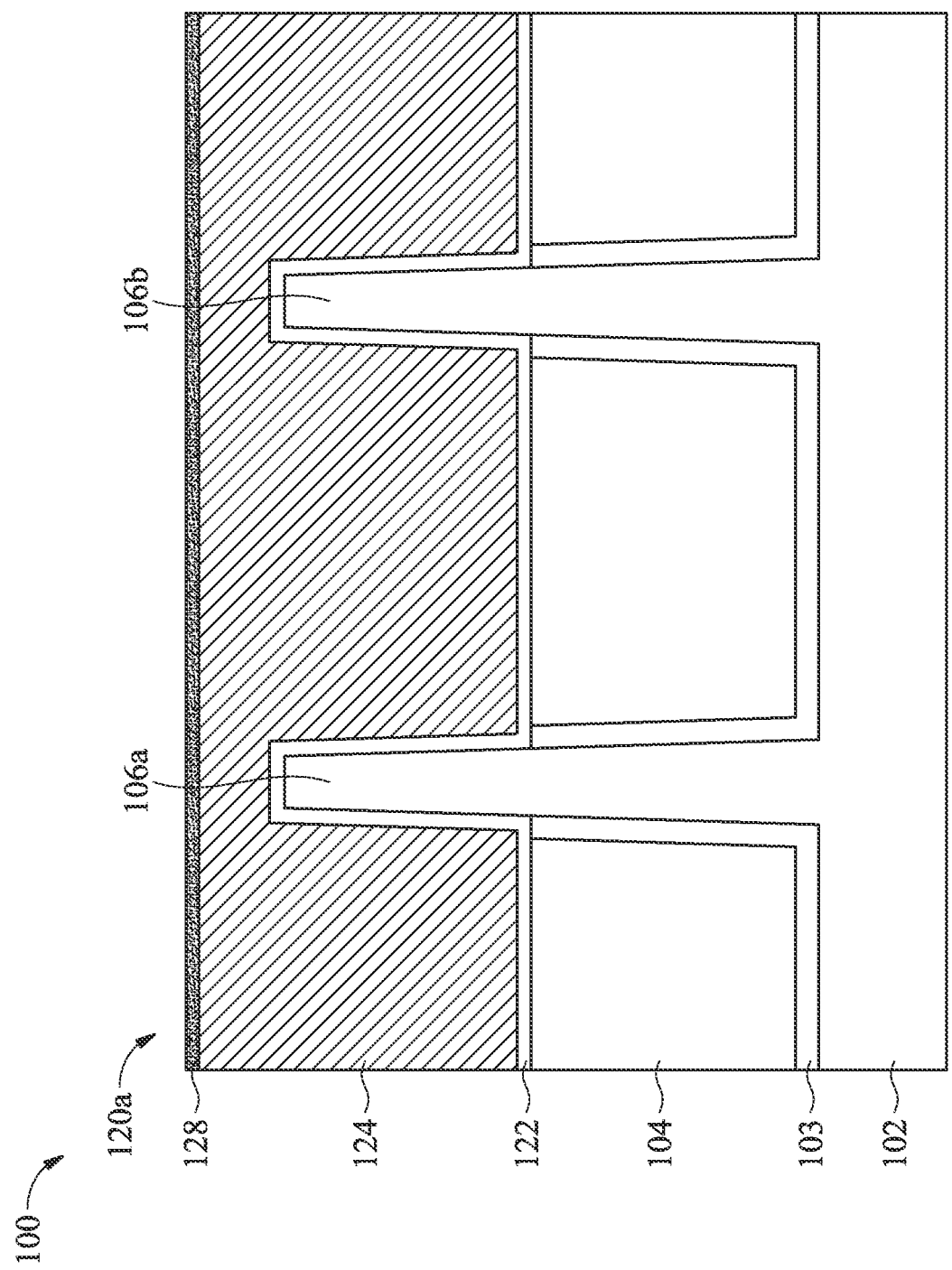
Figure 9C:
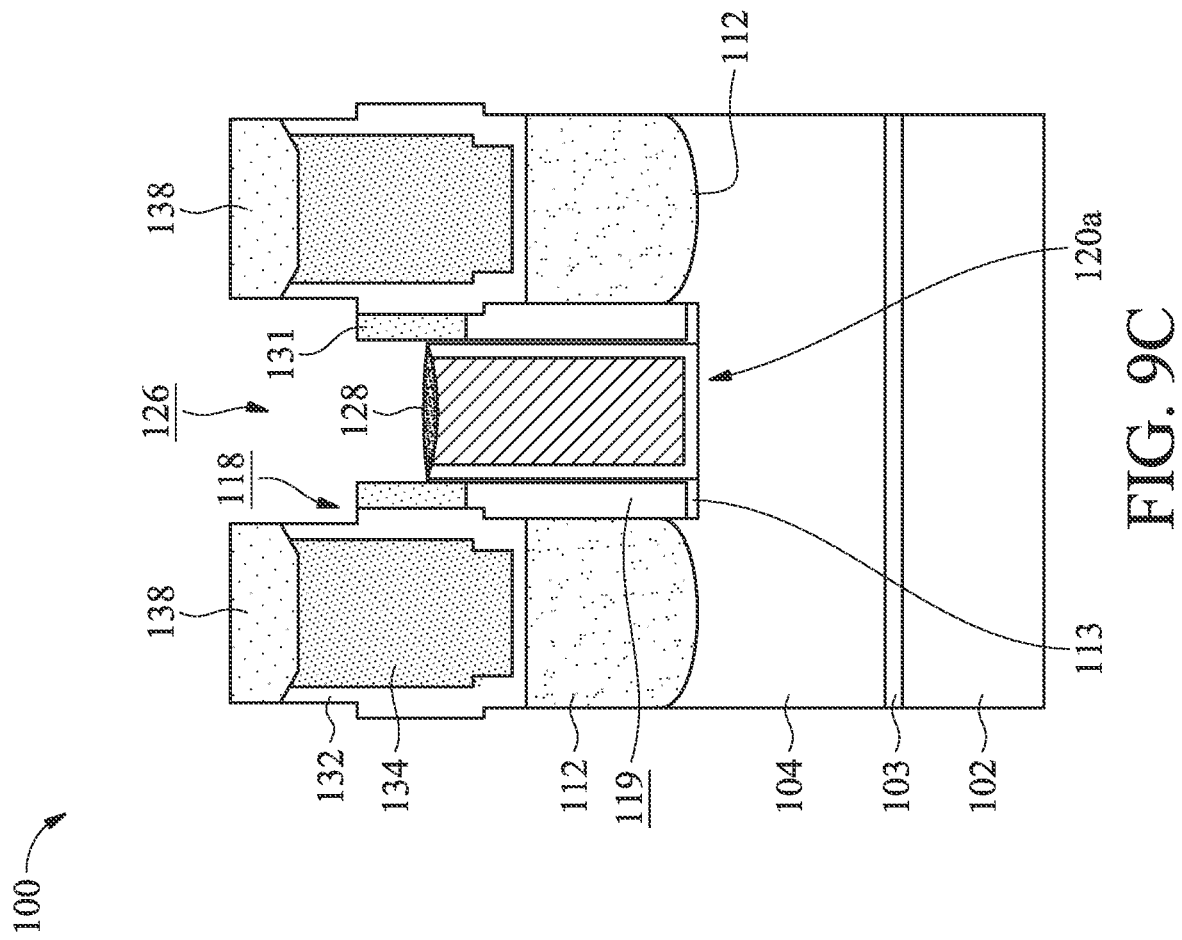

In addition, the sealing spacer material layer 130 on the metal cap layer 128 in a cross-section taken along line B-B in FIG. 1 is removed, as shown in FIG. 9B in accordance with some embodiments. FIG. 9C illustrates a cross-sectional view of the intermediate structure of FIG. 9A at this stage of fabricating a semiconductor device taken along line C-C in FIG. 1, in accordance with some embodiments. The air-gap spacer 119 is disposed under the sealing spacer 131. In some examples, the air-gap spacer 119 has a depth in a range from about 50 nm to about 70 nm in the cross-section taken along line C-C in FIG. 1.

Figure 10A:
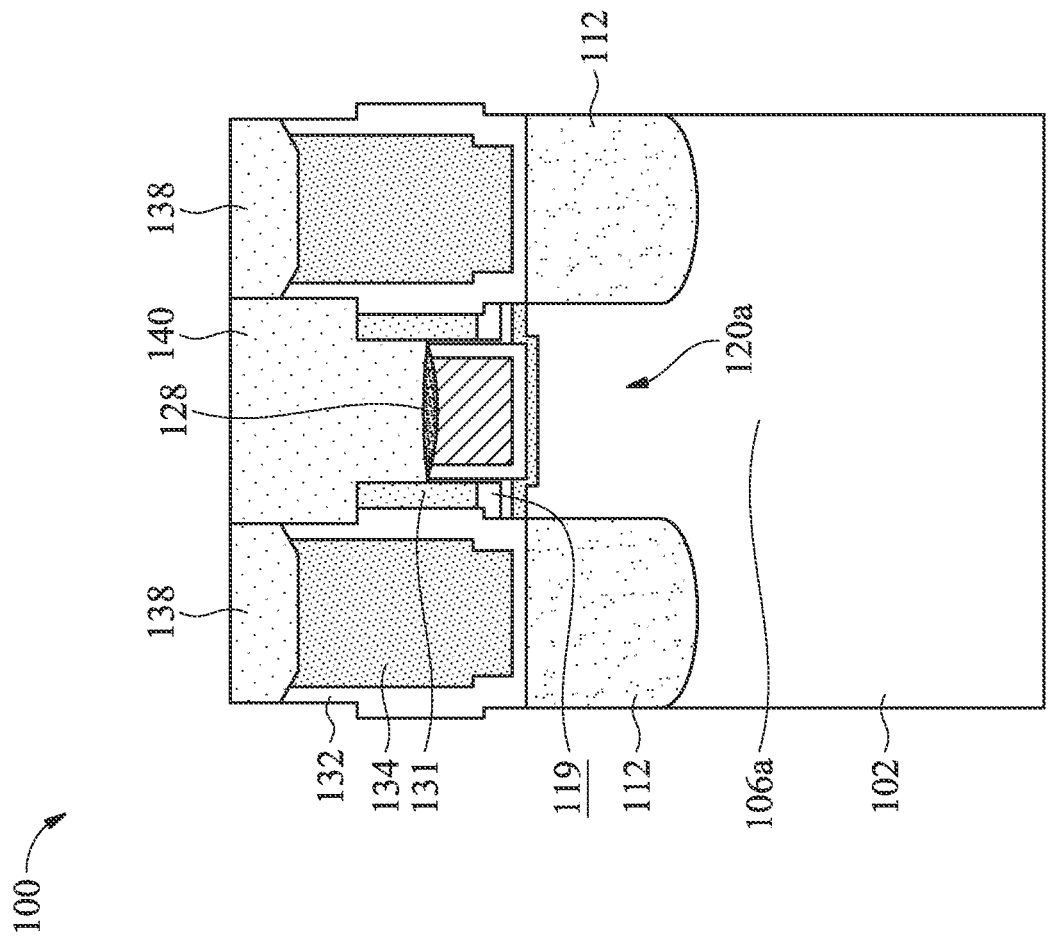
Figure 10B:
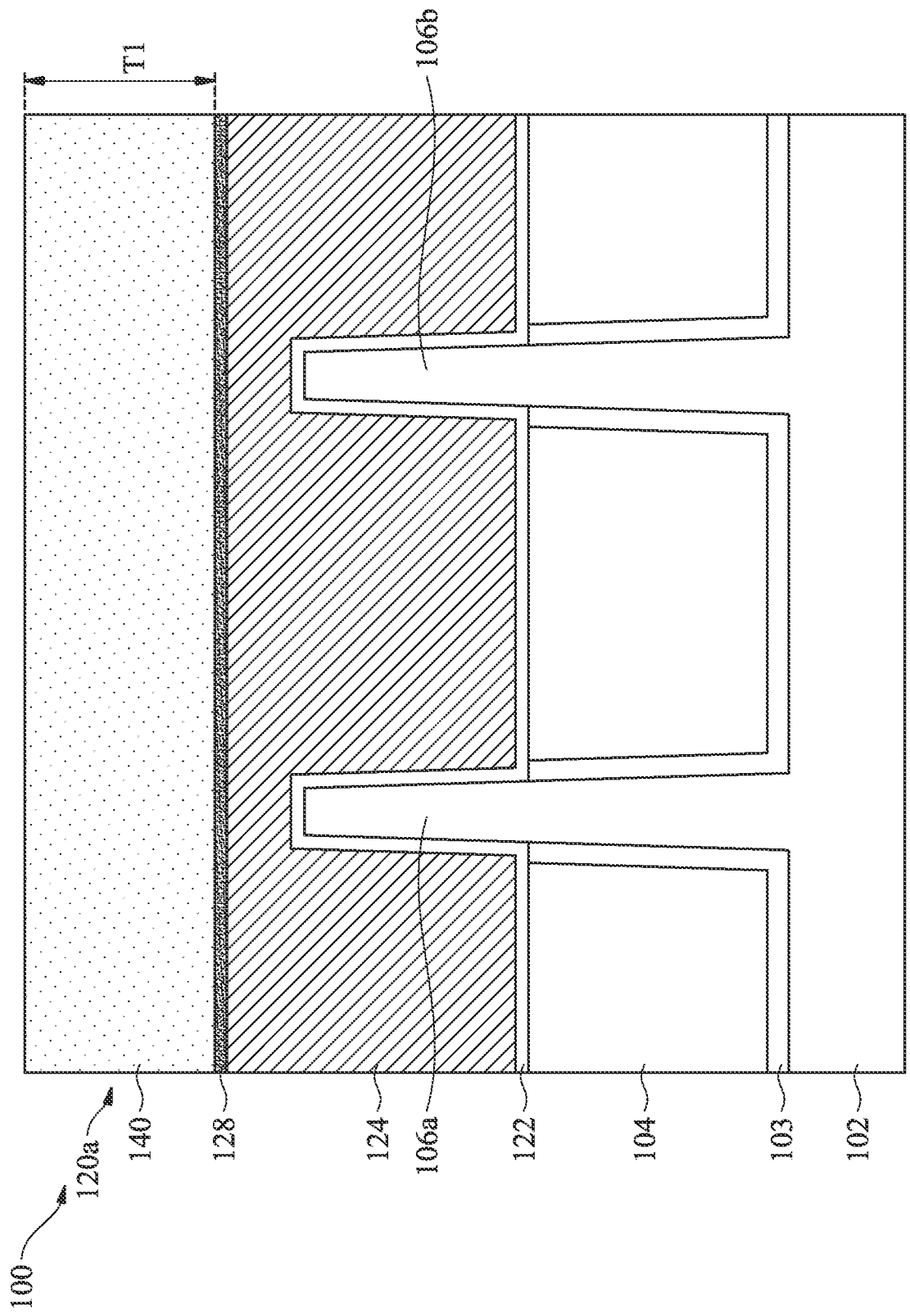

Afterwards, a hard mask 140 is formed on the replacement gate structure 120a, as shown in FIG. 10A in accordance with some embodiments, which is taken along line A-A in FIG. 1. The material layer of the hard mask 140 is deposited to fill the space 126 (FIG. 9A) above the replacement gate structure 120a and the recesses 118 (FIG. 9A) above the sealing spacers 131. Thereafter, the excess portion of the deposited material layer of the hard mask 140 on the hard mask 138 is removed in a planarization process, for example a CMP process. After the planarization process, the hard mask 140 is coplanar with the hard mask 138 on the ILD layer 132. Moreover, the hard mask 140 is formed over the sealing spacers 131. The material layer of the hard mask 140 may include silicon oxynitride (SiON), silicon nitride (SiN), silicon carbide (SiC), silicon carbon nitride (SiCN), or a combination thereof, and may be deposited by CVD, PVD, ALD, or another deposition process. In addition, the hard mask 140 is deposited on the metal cap layer 128 in a cross-section taken along line B-B in FIG. 1, as shown in FIG. 10B in accordance with some embodiments.

Figure 11A:
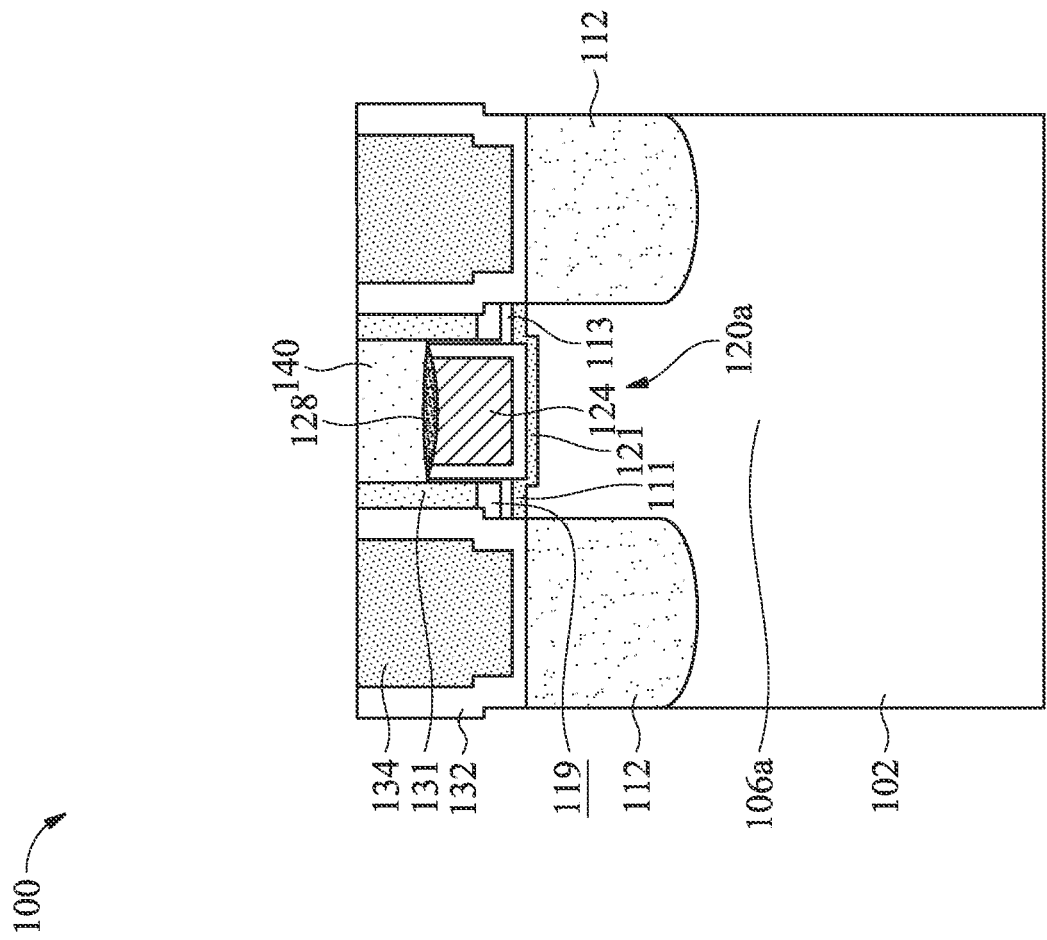

Next, the hard mask 138 on the ILD layer 132 and a portion of the hard mask 140 above the sealing spacer 131 are removed, as shown in FIG. 11A in accordance with some embodiments, which is taken along line A-A in FIG. 1. The hard mask 138 and the portion of the hard mask 140 are removed in a planarization process, for example a CMP process. In addition, a portion of the ILD layer 134 and a portion of the contact etch stop layer 132 above the sealing spacer 131 are removed in the planarization process until stop at the top surface of the sealing spacer 131. After the planarization process, the top surfaces of the hard mask 140, the sealing spacers 131, the contact etch stop layer 132 and the ILD layer 134 are coplanar.

Figure 11B:
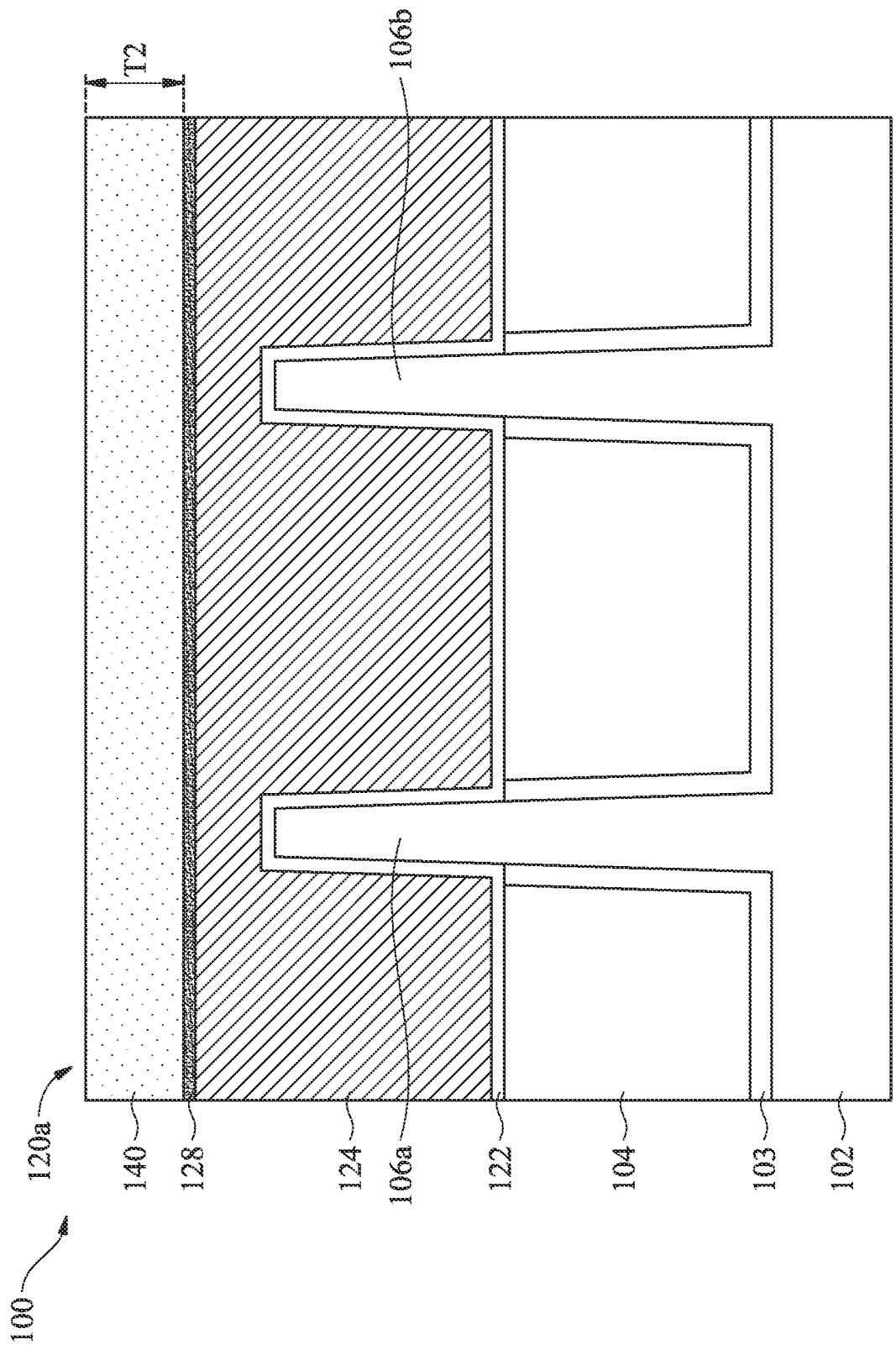

FIG. 11B illustrates a cross-sectional view of the structure of FIG. 11A at this stage of fabricating a semiconductor device taken along line B-B in FIG. 1, in accordance with some embodiments. After planarization process, the hard mask 140 in FIG. 11B has a thickness T2 that is thinner than the thickness T1 of the hard mask 140 in FIG. 10B.

Figure 11C:
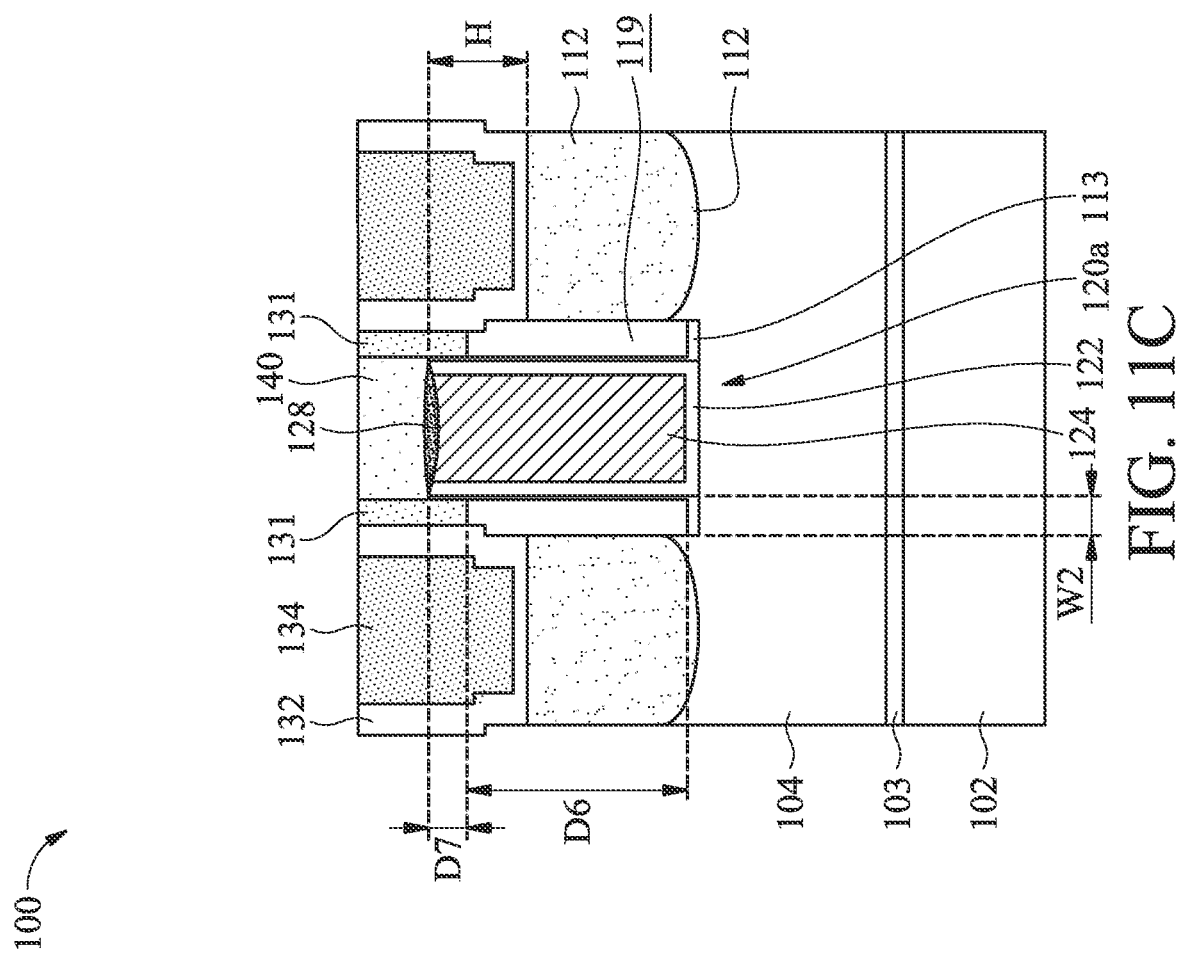

FIG. 11C illustrates a cross-sectional view of the structure of FIG. 11A at this stage of fabricating a semiconductor device taken along line C-C in FIG. 1, in accordance with some embodiments. The cross-section taken along line C-C in FIG. 1 is at the location of the isolation structure 104. In the cross-section, the air-gap spacers 119 under the sealing spacers 131 and above the inner sidewall spacer 113 have a depth D6. In some examples, the depth D6 is in a range from about 50 nm to about 70 nm. In addition, the sealing spacers 131 have a seal depth D7 below the top surface of the replacement gate structure 120a. In some examples, the seal depth D7 is in a range from about 0 nm to a gate height H. The gate height H is above the top surfaces of the source and drain regions 112. For example, the seal depth D7 is from about 0 nm to about 1nm. In addition, the sealing spacer 131. In some examples, the air-gap spacers 119 have a width W2 that is greater than about 20% of the distance between the gate dielectric layer 122 and the source or drain region 112 for performance tolerance of FinFET. In some examples, the width W2 of the air-gap spacer 119 is in a range from about 1nm to about 4 nm.

Figure 12:
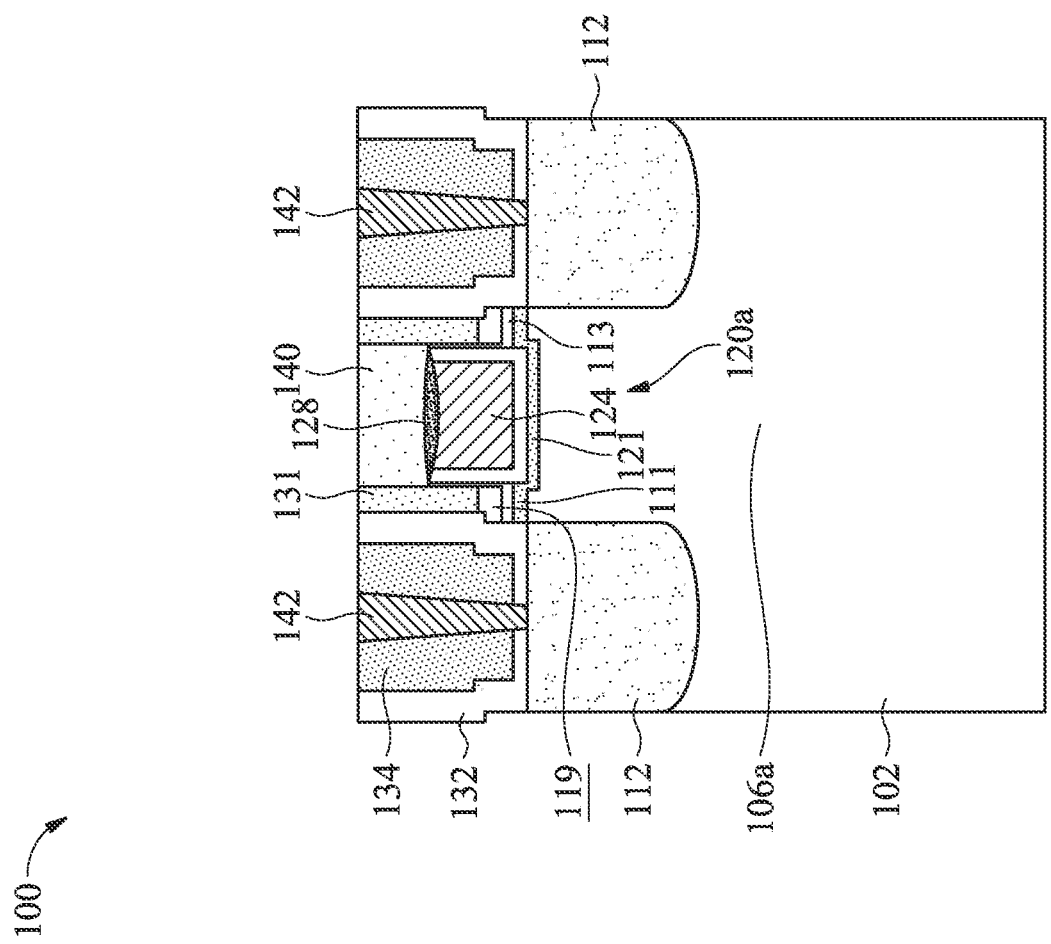

Afterwards, contacts 142 to the source and drain regions 112 are formed in the ILD layer 134, as shown in FIG. 12 in accordance with some embodiments, which is taken along line A-A in FIG. 1. The contacts 142 are formed to pass through the ILD layer 134 and to be in contact with the source and drain regions 112. The contacts 142 are formed by forming contact holes in the ILD layer 134 using photolithography and etching processes. The source and drain regions 112 are exposed through the contact holes. Thereafter, the contact holes are filled with a conductive material using a depositing process. Moreover, in each of the contact holes, a liner may be conformally deposited on the sidewalls and the bottom surface of the contact hole before filling the contact hole with the conductive material. The liner may be used as a diffusion barrier layer, an adhesion layer, or a combination thereof. The material of the liner may include titanium, titanium nitride, tantalum, tantalum nitride, or the like. The liner may be deposited by ALD, PECVD, MBD, PVD, or another deposition technique. In addition, an anneal process may be performed to facilitate a reaction between some portions of the liner and the source and drain regions 112 to form silicide regions at the respective source and drain regions 112. The conductive material includes a metal, such as cobalt, tungsten, copper, aluminum, gold, silver, alloys thereof, or a combination thereof, and may be deposited by CVD, ALD, PVD, or another deposition technique.

Next, excess portion of the conductive material over the ILD layer 134 is removed in a planarization process, such as a CMP process. The contacts 142 are formed to be coplanar with the ILD layer 134, the contact etch stop layer 132, the sealing spacers 131 and the hard mask 140. According to the embodiments, the hard mask 140 on the replacement gate structure 120a can be used in a self-aligned contact (SAC) process for forming the contacts 142 to the source and drain regions 112.

Figure 13:
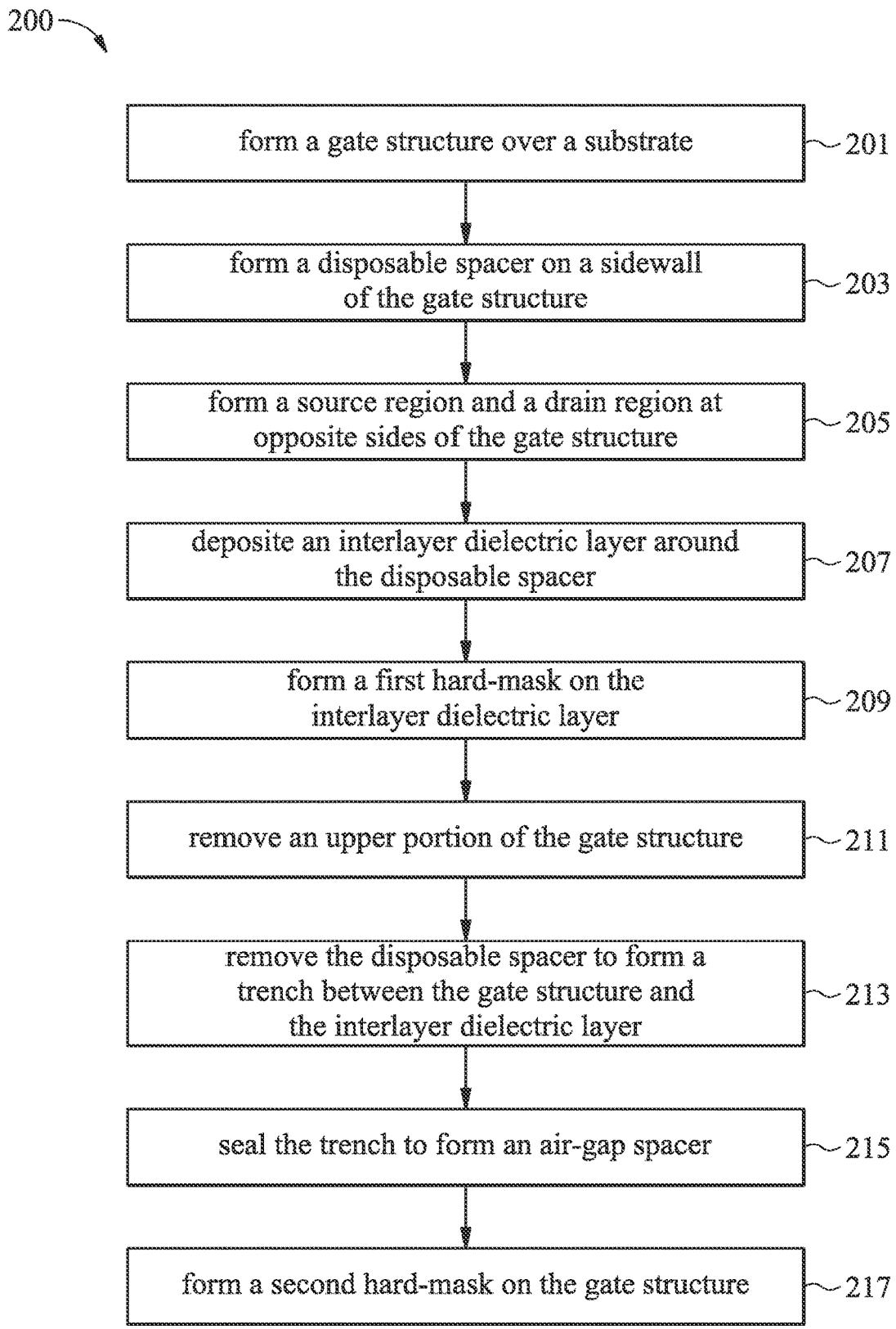
FIG. 13 is a flow chart of an exemplary method of fabricating a semiconductor device, in accordance with some embodiments.

FIG. 13 is a flow chart of an exemplary method 200 of fabricating a semiconductor device, in accordance with some embodiments. In block 201 of the method 200 and with reference to FIG. 2A, a gate structure is formed over a substrate. In some embodiments, the gate structure is a replacement gate structure 120a formed in a gate-last process and over the semiconductor substrate 102. In some embodiments, the replacement gate structure 120a is formed on the fin 106a that protrudes from the semiconductor substrate 102. The replacement gate structure 120a includes a gate dielectric layer 122 and a gate electrode layer 124 over the gate dielectric layer 122. In some embodiments, the gate dielectric layer 122 is a high-k gate dielectric layer and the gate electrode layer 124 is a metal gate electrode layer.

In block 203 of the method 200 (and still referring to FIG. 2A), a disposable spacer is formed on the sidewall of the gate structure. The disposable spacer 115 formed on the sidewall of the replacement gate structure 120a will be removed to form an air-gap spacer in the following processes. The material of the disposable spacer 115 has an etch selectivity that is greater than about 150 to the materials of several elements around the disposable spacer 115 in an etching process for removing the disposable spacer 115.

In block 205 of the method 200 (and still referring to FIG. 2A), source and drain regions are formed at opposite sides of the gate structure. In some embodiments, the source and drain regions 112 formed at opposite sides of the replacement gate structure 120a are epitaxial source and drain structures. In some embodiments, the source and drain regions 112 are formed in the fin 106a. The materials and the processes of forming the source and drain regions 112 are the same as or similar to those described with respect to FIG. 2A, and the details are not repeated herein.

In block 207 of the method 200 (and still referring to FIG. 2A), an interlayer dielectric (ILD) layer 134 is deposited around the disposable spacer 115. Also, the ILD layer 134 is deposited on the source and drain regions 112. In some embodiments, in a gate-last process, the ILD layer 134 is deposited around the disposable spacer 115 before forming the replacement gate structure 120a. The ILD layer 134 is deposited around a dummy gate structure that is surrounded by the disposable spacers 115. Next, the replacement gate structure 120a is formed at the place in which the dummy gate structure is removed.

In block 209 of the method 200 and with reference to FIG. 4, a first hard mask 138 is formed on the interlayer dielectric (ILD) layer 134. The first hard mask 138 can protect the ILD layer 134 during the etching process for removing the disposable spacers 115. The materials and the processes of forming the first hard mask 138 are the same as or similar to those described with respect to FIGS. 3 and 4, and the details are not repeated herein.

In block 211 of the method 200 and with reference to FIG. 5, an upper portion of the gate structure (also referred to as a replacement gate structure 120a) is removed in an etch-back process. As a result, a space 126 is formed between the disposable spacers 115. According to the embodiments, the disposable spacers 115 are exposed through the space 126.

In block 213 of the method 200 and with reference to FIGS. 7A and 7C, the disposable spacers 115 are removed using an etching process to form a trench 117 between the gate structure (also referred to as a replacement gate structure 120a) and the interlayer dielectric (ILD) layer 134. In the etching process, the material of disposable spacer 115 has an etch selectivity to the materials of the contact etch stop layer 132, the first hard mask 138 on the ILD layer 134, the inner sidewall spacer 113 under the disposable spacers 115, the replacement gate structure 120a, and the source and drain regions 112. In some examples, the etch selectivity is greater than about 150. Moreover, according to the embodiments of the disclosure, the disposable spacers 115 exposed through the space 126 can help the removing of the disposable spacers 115.

In block 215 of the method 200 and with reference to FIGS. 8A, 9A and 9C, the trench 117 is sealed by a sealing spacer 131 to form an air-gap spacer 119. According to the embodiments of the disclosure, the position of the air-gap spacer 119 can be self-aligned with the height of the replacement gate structure 120a.

In block 217 of the method 200 and with reference to FIGS. 10A and 11A, a second hard mask 140 is formed on the gate structure (also referred to as a replacement gate structure 120a). The materials and the processes of forming the second hard mask 140 are the same as or similar to those described with respect to FIGS. 10A and 11A, and the details are not repeated herein.

According to the embodiments of the disclosure, an air-gap spacer 119 is formed by using a gate etch-back process to create a space 126 to expose a disposable spacer 115, and then removing the disposable spacer 115 through the space 126 using an etching process to form a trench 117 between a replacement gate structure 120a and an ILD layer 134. Thereafter, the trench 117 is sealed with a sealing spacer 131 to form the air-gap spacer 119. Moreover, before the gate etch-back process and removing the disposable spacer 115, a hard mask 138 is formed on the ILD layer 134 to protect the ILD layer 134 during the gate etch-back process and the removing of the disposable spacer 115. Accordingly, utilizing the gate etch-back process to combine with the hard mask 138 on the ILD layer 134, the air-gap spacer 119 can be formed without additional photo-resist layer. The cost of fabricating the semiconductor devices is thereby reduced.

Furthermore, utilizing the gate etch-back process for forming the air-gap spacer 119, the depth of removing the disposable spacer 115 is reduced, and the gate-height loss is also reduced. Moreover, the position of the air-gap spacer 119 can be self-aligned with the height of the replacement gate structure 120a. Therefore, the performance variation of the semiconductor devices is reduced. In addition, the hard mask 138 is formed on the ILD layer 134 through a shallow recess. Therefore, the gate-height loss is reduced. In some examples, the gate-height loss is less than about 10 nm in the fabrication of the semiconductor devices in accordance with some embodiments of the disclosure.

In addition, according to the embodiments of the disclosure, a hard mask 140 is formed on the replacement gate structure 120a during the fabrication processes of the air-gap spacer 119. Therefore, the fabrication processes of the air-gap spacer 119 can be compatible with a gate-helmet process. The gate-helmet process is used for advanced middle-end-of-line (MEOL) process, which is a self-aligned contact (SAC) process for forming contacts to source and drain regions. Therefore, there is no need for an additional gate-helmet process according to the embodiments of the disclosure.

Moreover, according to the embodiments of the disclosure, after the air-gap spacer 119 is formed, there is no need to deposit a contact etch stop layer and an ILD layer. Therefore, the cost of fabricating the semiconductor devices is reduced. According to the benefits mentioned above, the embodiments of the disclosure are suitable for semiconductor devices at multiple technology nodes of 16 nm (N16), N10, N7, N5, N3 and beyond.

In some embodiments, a semiconductor device is provided. The semiconductor device includes a fin protruding from a semiconductor substrate and a gate structure formed across the fin. The semiconductor device also includes a gate spacer formed over a sidewall of the gate structure. The gate spacer includes a sidewall spacer and a sealing spacer formed above the sidewall spacer. In addition, an air gap is vertically sandwiched between the sidewall spacer and the sealing spacer. The semiconductor device further includes a hard mask formed over the gate structure and covering a sidewall of the sealing spacer.

In some embodiments, a semiconductor device is provided. The semiconductor device includes a fin protruding from a semiconductor substrate and extending along a first direction and a gate structure formed across the fin and extending along a second direction different from the first direction. The semiconductor device also includes a source/drain region formed in the fin and a gate spacer sandwiched between the gate structure and the source/drain region along the first direction. The gate spacer includes a sidewall spacer and a sealing spacer formed above the sidewall spacer. In addition, an air gap is sandwiched between the sidewall spacer and the sealing spacer along a third direction and is sandwiched between the source/drain region and the gate structure along the first direction.

In some embodiments, a semiconductor device is provided. The semiconductor device includes a fin protruding from a semiconductor substrate and a gate structure formed over a channel region of the fin. The semiconductor device also includes a metal cap layer formed over the gate structure and a hard mask formed over the metal cap layer. The semiconductor device further includes a source/drain region formed in the fin and a gate spacer formed between the channel region and the source/drain region over the fin. The gate spacer includes a sealing spacer covering a sidewall of the hard mask and a sidewall spacer below the sealing spacer and covering a sidewall of the gate structure. In addition, an air gap is formed between the channel region and the source/drain region and partially exposes the sealing spacer and the sidewall spacer.

In some embodiments, a method of fabricating a semiconductor device is provided. The method includes forming a gate structure over a substrate, forming a disposable spacer on a sidewall of the gate structure, and forming a source region and a drain region at opposite sides of the gate structure. The method also includes depositing an interlayer dielectric layer around the disposable spacer, and forming a first hard mask on the interlayer dielectric layer. The method further includes removing an upper portion of the gate structure, and removing the disposable spacer to form a trench between the gate structure and the interlayer dielectric layer. In addition, the method includes sealing the trench to form an air-gap spacer, and forming a second hard mask on the gate structure.

In some embodiments, a method of fabricating a semiconductor device is provided. The method includes forming a gate structure on a fin that protrudes from a semiconductor substrate, and depositing disposable spacers on sidewalls of the gate structure. The method also includes forming a source region and a drain region in the fin and at opposite sides of the gate structure, and depositing an interlayer dielectric layer over the source region and the drain region. The method further includes removing an upper portion of the gate structure to form a space between the disposable spacers. In addition, the method includes removing the disposable spacer to form a trench between the gate structure and the interlayer dielectric layer, and sealing the trench to form an air-gap spacer.

In some embodiments, a semiconductor device is provided. The semiconductor device includes a fin protruding from a semiconductor substrate, and a gate structure over the fin. The semiconductor device also includes a source region and a drain region in the fin and at opposite sides of the gate structure. The semiconductor device further includes a gate spacer on a sidewall of the gate structure, in which the gate spacer includes an air-gap spacer and a sealing spacer above the air-gap spacer. In addition, the semiconductor device includes a hard mask on the gate structure, in which the hard mask has a top surface that is coplanar with the sealing spacer.

In some embodiments, a semiconductor device is provided. The semiconductor device includes a fin protruding from a semiconductor substrate and a gate structure over the fin. The semiconductor device also includes a source region and a drain region in the fin and at opposite sides of the gate structure. The semiconductor device further includes a gate spacer on a sidewall of the gate structure. The gate spacer includes an air-gap spacer and a sealing spacer above the air-gap spacer, an upper portion of the gate structure is laterally overlapping with the sealing spacer, and the bottom portion of the gate structure is laterally overlapping with the air gap spacer.

In some embodiments, the semiconductor device further includes a hard mask on the gate structure. The hard mask has a top surface that is coplanar with the sealing spacer. The semiconductor device also includes a metal cap layer between the hard mask and the gate structure. In some embodiments, a top surface of the metal cap layer is lower than a top surface of the sealing spacer. In some embodiments, the semiconductor device further includes an interlayer dielectric layer over the source region and the drain region. The interlayer dielectric layer has a top surface that is coplanar with the sealing spacer and the hard mask. In some embodiments, the semiconductor device further includes a contact formed in the interlayer dielectric layer. The contact is in contact with the source region and the drain region. In some embodiments, the semiconductor device further includes a contact etch stop layer formed around the sealing spacer. A top surface of the contact etch stop layer is coplanar with a top surface of the sealing spacer. In some embodiments, the semiconductor device further includes an inner sidewall spacer formed between the fin and the air-gap spacer. In some embodiments, the sealing spacer is in contact with the inner sidewall spacer. In some embodiments, the air-gap spacer includes an upper portion and a lower portion, and a width of the upper portion is different from a width of the lower portion.

In some embodiments, a semiconductor device is provided. The semiconductor device includes a fin protruding from a semiconductor substrate and a gate structure over the fin. The gate structure includes a gate electrode layer and a gate dielectric layer surrounding the gate electrode layer. The semiconductor device also includes an inner sidewall spacer on a sidewall of the gate structure, and a source region and a drain region in the fin and at opposite sides of the gate structure. The semiconductor device further includes a gate spacer on a sidewall of the gate structure. The gate spacer includes an air-gap spacer and a sealing spacer above the air-gap spacer, and the gate dielectric layer is in contact with the sealing spacer, the air gap spacer, and the inner sidewall spacer. In addition, the semiconductor device includes a hard mask located adjacent to the sealing spacer.

In some embodiments, the semiconductor device further includes a metal cap layer on the gate structure. A top surface of the metal cap layer is lower than a top surface of the sealing spacer. In some embodiments, the semiconductor device further includes an interlayer dielectric layer over the source region and the drain region. A top surface of the interlayer dielectric layer is coplanar with a top surface of the sealing spacer. In some embodiments, the semiconductor device further includes a contact etch stop layer formed around the sealing spacer. A top surface of the contact etch stop layer is coplanar with a top surface of the sealing spacer. In some embodiments, a top surface of the metal cap layer is higher than a top surface of the air-gap spacer. In some embodiments, the air-gap spacer includes an upper portion and a lower portion, and a width of the upper portion is different from a width of the lower portion.

In some embodiments, a semiconductor device is provided. The semiconductor device includes a gate structure over a semiconductor substrate and a source region and a drain region at opposite sides of the gate structure. The semiconductor device also includes an inner sidewall spacer on a sidewall of the gate structure, and a gate spacer around the gate structure. The gate spacer includes an air-gap spacer and a sealing spacer above the air-gap spacer. The semiconductor device further includes an interlayer dielectric layer around the gate spacer. The air-gap spacer is located between the inner sidewall spacer and the interlayer dielectric layer.

In some embodiments, the inner sidewall spacer extends directly below the air-gap spacer. In some embodiments, the semiconductor device further includes a metal cap layer on the gate structure, and a hard mask separated from the gate structure via the metal cap layer. In some embodiments, the air-gap spacer includes an upper portion and a lower portion, and a width of the upper portion is different from a width of the lower portion. In some embodiments, the width of the upper portion of the air gap spacer is substantially the same as a width of a bottom portion of the sealing spacer, and the width of the lower portion of the air gap spacer is substantially the same as a width of an upper portion of the inner sidewall spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a fin protruding from a semiconductor substrate;
    a gate structure formed across the fin;
    a gate spacer formed over a sidewall of the gate structure, wherein the gate spacer comprises:
        a sidewall spacer; and
        a sealing spacer formed above the sidewall spacer, wherein an air gap is vertically sandwiched between the sidewall spacer and the sealing spacer; and
    a hard mask formed over the gate structure and covering a sidewall of the sealing spacer.

2. The semiconductor device as claimed in claim 1, wherein a bottom surface of the sealing spacer is exposed by the air gap and is lower than a top surface of the gate structure.

3. The semiconductor device as claimed in claim 2, wherein the bottom surface of the sealing spacer is higher than a bottom surface of the gate structure.

4. The semiconductor device as claimed in claim 1, wherein the gate structure comprises:
    an interfacial layer;
    a gate dielectric layer formed over the interfacial layer; and
    a gate electrode layer formed over the gate dielectric layer,
    wherein the air gap vertically overlaps the interfacial layer.

5. The semiconductor device as claimed in claim 4, further comprising:
    a metal cap layer sandwiched between the gate structure and the hard mask, wherein the metal cap layer is in direct contact with the gate dielectric layer and the gate electrode layer and is spaced apart from the interfacial layer.

6. The semiconductor device as claimed in claim 4, wherein a middle portion of the interfacial layer is lower than an edge portion of the interfacial layer.

7. A semiconductor device, comprising:
    a fin protruding from a semiconductor substrate and extending along a first direction;

a gate structure formed across the fin and extending along a second direction different from the first direction;
a source/drain region formed in the fin;
a gate spacer sandwiched between the gate structure and the source/drain region along the first direction, wherein the gate spacer comprises:
a sidewall spacer; and
a sealing spacer formed above the sidewall spacer, wherein an air gap is sandwiched between the sidewall spacer and the sealing spacer along a third direction and is sandwiched between the source/drain region and the gate structure along the first direction.

8. The semiconductor device as claimed in claim 7, wherein a top portion of the air gap is higher than a top surface of the source/drain region, and a bottom portion of the air gap is lower than the top surface of the source/drain region.

9. The semiconductor device as claimed in claim 7, wherein a bottom portion of the air gap is higher than a bottom portion of the source/drain region.

10. The semiconductor device as claimed in claim 7, wherein the sidewall spacer has a first width along the first direction, the sealing spacer has a second width along the first direction, and the first width is greater than the second width.

11. The semiconductor device as claimed in claim 7, wherein a bottom surface of the sealing spacer is exposed by the air gap and is lower than a top surface of the gate structure.

12. The semiconductor device as claimed in claim 11, wherein a top surface of the sealing spacer is higher than a top surface of the gate structure.

13. The semiconductor device as claimed in claim 11, wherein the bottom surface of the sealing spacer is lower than a top surface of the sidewall spacer.

14. The semiconductor device as claimed in claim 7, further comprising:
a metal cap layer formed over the gate structure; and
a hard mask formed over the metal cap layer,
wherein the hard mask has a first dimension along the first direction, the gate structure has a second dimension along the first direction, and the first dimension is greater than the second dimension.

15. A semiconductor device, comprising:
a fin protruding from a semiconductor substrate;
a gate structure formed over a channel region of the fin;
a metal cap layer formed over the gate structure;
a hard mask formed over the metal cap layer;
a source/drain region formed in the fin; and
a gate spacer formed between the channel region and the source/drain region over the fin,
wherein the gate spacer comprises:
a sealing spacer covering a sidewall of the hard mask; and
a sidewall spacer below the sealing spacer and covering a sidewall of the gate structure,
wherein an air gap is formed between the channel region and the source/drain region and partially exposes the sealing spacer and the sidewall spacer.

16. The semiconductor device as claimed in claim 15, wherein the sealing spacer has a first sidewall and a second sidewall opposite to the first sidewall, and the air gap is vertically under the sealing spacer and laterally protrudes outside the second sidewall of the sealing spacer.

17. The semiconductor device as claimed in claim 16, wherein the first sidewall of the sealing spacer is in direction contact with the hard mask.

18. The semiconductor device as claimed in claim 16, wherein the sidewall spacer partially covers the first sidewall of the sealing spacer.

19. The semiconductor device as claimed in claim 15, wherein a lateral width of the sidewall spacer between the channel region and the source/drain region is greater than a lateral width of the sealing spacer between the channel region and the source/drain region.

20. The semiconductor device as claimed in claim 15, wherein a portion of the air gap is laterally sandwiched between the source/drain region and the gate structure.

* * * * *